(12) United States Patent
Kim

(10) Patent No.: US 9,748,201 B2
(45) Date of Patent: Aug. 29, 2017

(54) SEMICONDUCTOR PACKAGES INCLUDING AN INTERPOSER

(71) Applicant: SK hynix Inc., Icheon-si, Gyeonggi-do (KR)

(72) Inventor: Jong Hoon Kim, Suwon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 2 days.

(21) Appl. No.: 14/807,476

(22) Filed: Jul. 23, 2015

(65) Prior Publication Data

US 2016/0218081 A1  Jul. 28, 2016

(30) Foreign Application Priority Data

Jan. 22, 2015  (KR) .......................... 10-2015-0010834

(51) Int. Cl.
*H01L 25/065*    (2006.01)
*H01L 23/00*     (2006.01)
(Continued)

(52) U.S. Cl.
CPC .... *H01L 25/0652* (2013.01); *H01L 23/49827* (2013.01); *H01L 23/50* (2013.01); *H01L 24/19* (2013.01); *H01L 24/20* (2013.01); *H01L 25/03* (2013.01); *H01L 25/0657* (2013.01); *H01L 23/13* (2013.01); *H01L 23/36* (2013.01); *H01L 23/49811* (2013.01); *H01L 23/49838* (2013.01); *H01L 24/06* (2013.01); *H01L 24/13* (2013.01); *H01L 24/16* (2013.01); *H01L 24/17* (2013.01); *H01L 24/73* (2013.01); *H01L 2224/0401* (2013.01); *H01L 2224/04105* (2013.01); *H01L 2224/06181* (2013.01); *H01L 2224/12105* (2013.01); *H01L 2224/13025* (2013.01); *H01L 2224/16145* (2013.01); *H01L 2224/16146* (2013.01); *H01L 2224/16227* (2013.01); *H01L 2224/17181* (2013.01);
(Continued)

(58) Field of Classification Search
CPC .................................................. H01L 25/0652
See application file for complete search history.

(56) References Cited

U.S. PATENT DOCUMENTS

2010/0283085 A1* 11/2010 Bemanian ............... H01L 24/14
                                                      257/209
2014/0191419 A1*  7/2014 Mallik ................ H01L 25/0652
                                                      257/777
2014/0203457 A1*  7/2014 Kim ........................ H01L 25/18
                                                      257/778

FOREIGN PATENT DOCUMENTS

KR    20140095182 A    8/2014

* cited by examiner

*Primary Examiner* — Peniel M Gumedzoe
*Assistant Examiner* — Christopher Johnson
(74) *Attorney, Agent, or Firm* — William Park & Associates Ltd.

(57) ABSTRACT

A semiconductor package may include a first semiconductor chip, second semiconductor chips disposed to respectively overlap with portions of the first semiconductor chip, a interposer disposed to overlap with a portion of the first semiconductor chip, and a package substrate disposed on backside surfaces of the second semiconductor chips opposite to the first semiconductor chip. The interposer may be disposed between the first semiconductor chip and the package substrate. First conductive coupling members connect the first semiconductor chip to the second semiconductor chips. Second conductive coupling members connect the first semiconductor chip to the interposer. Third conductive coupling members connect the interposer to the package substrate.

19 Claims, 22 Drawing Sheets

(51) Int. Cl.
    *H01L 23/50*        (2006.01)
    *H01L 25/03*        (2006.01)
    *H01L 23/13*         (2006.01)
    *H01L 23/36*         (2006.01)
    *H01L 23/498*      (2006.01)

(52) U.S. Cl.
    CPC ............... *H01L 2224/73253* (2013.01); *H01L 2225/06513* (2013.01); *H01L 2225/06517* (2013.01); *H01L 2225/06541* (2013.01); *H01L 2225/06589* (2013.01); *H01L 2924/1434* (2013.01); *H01L 2924/15153* (2013.01); *H01L 2924/15192* (2013.01); *H01L 2924/15311* (2013.01); *H01L 2924/18161* (2013.01)

SEMICONDUCTOR PACKAGES INCLUDING AN INTERPOSER

CROSS-REFERENCE TO RELATED APPLICATION

The present application claims priority under 35 U.S.C 119(a) to Korean Application No. 10-2015-0010834, filed on Jan. 22, 2015, in the Korean intellectual property Office, which is incorporated herein by reference in its entirety.

BACKGROUND

1. Technical Field

Embodiments of the present disclosure generally relate to semiconductor packages and, more particularly, to semiconductor packages including an interposer and electronic systems including the same.

2. Related Art

Semiconductor packages capable of processing a large amount of data are increasingly in demand, as is the development of smaller electronic systems such as mobile systems. Recently, system-in-package (SIP) techniques for encapsulating a plurality of semiconductor chips having different functions in a single package have been proposed to create high performance electronic systems. 2.5-dimensional (2.5D) or 3-dimensional (3D) SIPs, each including at least one micro-processor chip and at least one memory chip, have been tried.

SUMMARY

According to an embodiment, a semiconductor package may include a first semiconductor chip including a first group of first contact portions, a second group of first contact portions, a third group of first contact portions and a fourth group of first contact portions disposed on a front side surface thereof. The second group of first contact portions may be connected to the third group of first contact portions through a second group of first internal interconnection lines. Second semiconductor chips may be disposed on the front side surface of the first semiconductor chip to respectively overlap with portions of the first semiconductor chip. Each of the second semiconductor chips may include a first group of second contact portions and a second group of second contact portions that are disposed on a front side surface thereof to respectively face the first group of first contact portions and the second group of first contact portions. An interposer may be disposed on the front side surface of the first semiconductor chip to overlap with a portion of the first semiconductor chip. The interposer may include a second group of third contact portions and a first group of third contact portions disposed on a front side surface thereof to respectively face the third and fourth groups of first contact portions. A package substrate may be disposed on backside surfaces of the second semiconductor chips opposite to the first semiconductor chip. The interposer may be disposed between the first semiconductor chip and the package substrate. A first group of first conductive coupling members electrically connect the first group of first contact portions to the first group of second contact portions, and a second group of first conductive coupling members electrically connect the second group of first contact portions to the second group of second contact portions. A second group of second conductive coupling members electrically connect the third group of first contact portions to the second group of third contact portions, and a first group of second conductive coupling members electrically connect the fourth group of first contact portions to the first group of third contact portions. Third conductive coupling members combine the interposer with the package substrate.

According to an embodiment, a semiconductor package may include a first semiconductor chip, second semiconductor chips disposed to respectively overlap with portions of the first semiconductor chip, an interposer disposed to overlap with a portion of the first semiconductor chip, and a package substrate disposed on backside surfaces of the second semiconductor chips opposite to the first semiconductor chip. The interposer may be disposed between the first semiconductor chip and the package substrate. First conductive coupling members electrically connect the first semiconductor chip to the second semiconductor chips. Second conductive coupling members electrically connect the first semiconductor chip to the interposer. Third conductive coupling members electrically connect the interposer to the package substrate.

According to an embodiment, a semiconductor package may include a first semiconductor chip, second semiconductor chips disposed to respectively overlap with portions of the first semiconductor chip, an interposer disposed to overlap with a portion of the first semiconductor chip, a support interposer supporting the interposer, and a package substrate disposed on backside surfaces of the second semiconductor chips opposite to the first semiconductor chip. A stack structure of the interposer and the support interposer is disposed between the first semiconductor chip and the package substrate. First conductive coupling members electrically connect the first semiconductor chip to the second semiconductor chips. Second conductive coupling members electrically connect the first semiconductor chip to the interposer. Third conductive coupling members electrically connect the interposer to the support interposer. Fourth conductive coupling members electrically connect the support interposer to the package substrate.

According to an embodiment, a semiconductor package may include a first semiconductor chip, second semiconductor chips disposed to respectively overlap with portions of the first semiconductor chip, an interposer disposed to overlap with a portion of the first semiconductor chip, and a package substrate disposed on backside surfaces of the second semiconductor chips opposite to the first semiconductor chip. The interposer is disposed between the first semiconductor chip and the package substrate. A second group of first internal interconnection lines electrically connect a second group of first contact portions disposed on a front side surface of the first semiconductor chip to a third group of first contact portions disposed on the front side surface of the first semiconductor chip. A second group of second contact portions may be disposed on a front side surface of each of the second semiconductor chips to face the second group of first contact portions. A second group of third contact portions may be disposed on a surface of the interposer opposite to the package substrate to face the third group of first contact portions. A second group of first conductive coupling members electrically connect the second group of first contact portions to the second group of second contact portions. A second group of second conductive coupling members electrically connect the third group of first contact portions to the second group of third contact portions. The second group of first contact portions, the third group of first contact portions, the second group of first internal interconnection lines, the second group of second contact portions, the second group of third contact portions, the second group of first conductive coupling members, and the second group of second conductive coupling members constitute second electric signal paths that electrically connect the interposer to the second semiconductor chips.

According to an embodiment, there may be provided an electronic system including a package. The package may include a first semiconductor chip including a first group of first contact portions, a second group of first contact portions, a third group of first contact portions and a fourth group of first contact portions disposed on a front side surface thereof. The second group of first contact portions may be connected to the third group of first contact portions through a second group of first internal interconnection lines. Second semiconductor chips may be disposed on the front side surface of the first semiconductor chip to respectively overlap with portions of the first semiconductor chip. Each of the second semiconductor chips includes a first group of second contact portions and a second group of second contact portions that may be disposed on a front side surface thereof to respectively face the first group of first contact portions and the second group of first contact portions. An interposer may be disposed on the front side surface of the first semiconductor chip to overlap with a portion of the first semiconductor chip. The interposer may include a second group of third contact portions and a first group of third contact portions disposed on a front side surface thereof to respectively face the third and fourth groups of first contact portions. A package substrate is disposed on backside surfaces of the second semiconductor chips opposite to the first semiconductor chip. The interposer may be disposed between the first semiconductor chip and the package substrate. A first group of first conductive coupling members electrically connect the first group of first contact portions to the first group of second contact portions, and a second group of first conductive coupling members electrically connect the second group of first contact portions to the second group of second contact portions. A second group of second conductive coupling members electrically connect the third group of first contact portions to the second group of third contact portions, and a first group of second conductive coupling members electrically connect the fourth group of first contact portions to the first group of third contact portions. Third conductive coupling members combine the interposer with the package substrate.

According to an embodiment, there is provided an electronic system including a package. The package may include a first semiconductor chip, second semiconductor chips disposed to respectively overlap with portions of the first semiconductor chip, an interposer disposed to overlap with a portion of the first semiconductor chip, and a package substrate disposed on backside surfaces of the second semiconductor chips opposite to the first semiconductor chip. The interposer may be disposed between the first semiconductor chip and the package substrate. First conductive coupling members electrically connect the first semiconductor chip to the second semiconductor chips. Second conductive coupling members electrically connect the first semiconductor chip to the interposer. Third conductive coupling members electrically connect the interposer to the package substrate.

According to an embodiment, there may be provided an electronic system including a package. The package may include a first semiconductor chip, second semiconductor chips disposed to respectively overlap with portions of the first semiconductor chip, an interposer disposed to overlap with a portion of the first semiconductor chip, a support interposer supporting the interposer, and a package substrate disposed on backside surfaces of the second semiconductor chips opposite to the first semiconductor chip. A stack structure of the interposer and the support interposer may be disposed between the first semiconductor chip and the package substrate. First conductive coupling members electrically connect the first semiconductor chip to the second semiconductor chips. Second conductive coupling members electrically connect the first semiconductor chip to the interposer. Third conductive coupling members electrically connect the interposer to the support interposer. Fourth conductive coupling members electrically connect the support interposer to the package substrate.

According to an embodiment, there may be provided an electronic system including a package. The package may include a first semiconductor chip, second semiconductor chips disposed to respectively overlap with portions of the first semiconductor chip, an interposer disposed to overlap with a portion of the first semiconductor chip, and a package substrate disposed on backside surfaces of the second semiconductor chips opposite to the first semiconductor chip. The interposer may be disposed between the first semiconductor chip and the package substrate. A second group of first internal interconnection lines electrically connect a second group of first contact portions disposed on a front side surface of the first semiconductor chip to a third group of first contact portions disposed on the front side surface of the first semiconductor chip. A second group of second contact portions may be disposed on a front side surface of each of the second semiconductor chips to face the second group of first contact portions. A second group of third contact portions may be disposed on a surface of the interposer opposite to the package substrate to face the third group of first contact portions. A second group of first conductive coupling members electrically connect the second group of first contact portions to the second group of second contact portions. A second group of second conductive coupling members electrically connect the third group of first contact portions to the second group of third contact portions. The second group of first contact portions, the third group of first contact portions, the second group of first internal interconnection lines, the second group of second contact portions, the second group of third contact portions, the second group of first conductive coupling members, and the second group of second conductive coupling members constitute second electric signal paths that electrically connect the interposer to the second semiconductor chips.

DETAILED DESCRIPTION OF THE EMBODIMENTS

Figure 1:
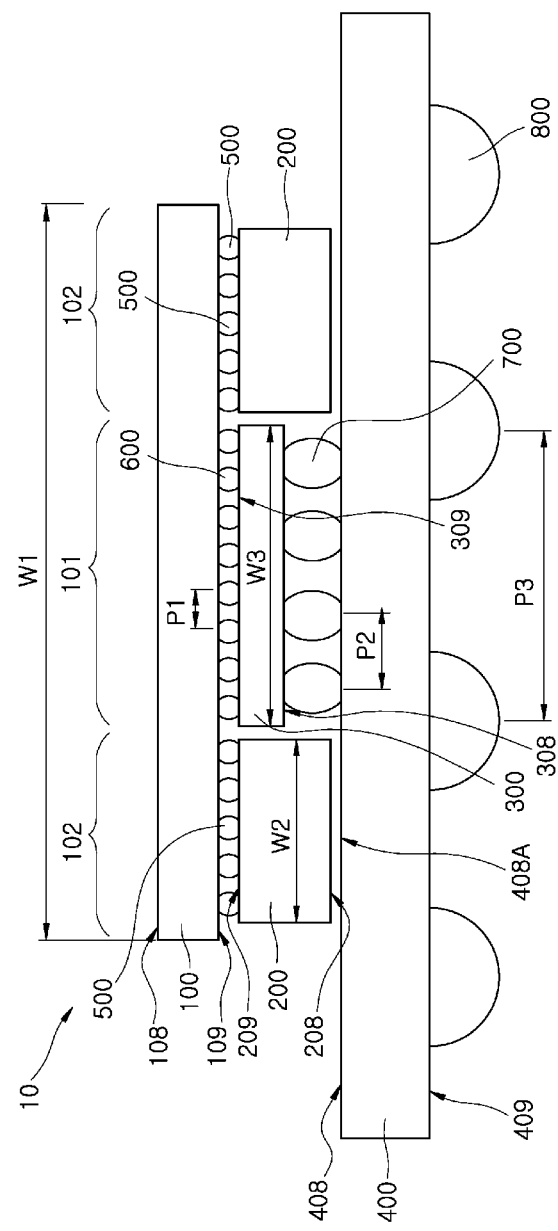
FIG. 1 is a cross-sectional view illustrating a representation of an example of a semiconductor package according to an embodiment.

It will be understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the inventive concept.

It will also be understood that when an element is referred to as being "on," "above," "below," or "under" another element, it can be directly "on," "above," "below," "under," "in," or "inside" the other element, respectively, or intervening elements may also be present. Accordingly, the terms such as "on," "above," "below," "under," "in," or "inside" which are used herein are for the purpose of describing particular embodiments only and are not intended to limit the inventive concept.

It will be further understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion.

In the following embodiments, semiconductor chips may be obtained by separating a semiconductor substrate such as a wafer into a plurality of dies using a die sawing process. In some cases, each of the semiconductor chips may include a semiconductor die mounted on a package substrate or a plurality of semiconductor die stacked on a package substrate. If a plurality of semiconductor die are stacked on a package substrate to form a semiconductor package, the plurality of semiconductor die may be electrically connected to each other by through electrodes (or through vias) such as through silicon vias (TSVs). The semiconductor chips may correspond to memory chips. The memory chips may include dynamic random access memory (DRAM) circuits, static random access memory (SRAM) circuits, flash circuits, magnetic random access memory (MRAM) circuits, resistive random access memory (ReRAM) circuits, ferroelectric random access memory (FeRAM) circuits or phase change random access memory (PcRAM) circuits which are integrated on and/or in the semiconductor substrate.

In some embodiments, the semiconductor chip may corresponds to a logic chip, for example, a system on chip (SoC) having various functions. The SoC may include a microprocessor, a microcontroller, a digital signal processing core or an interface. The microprocessor may include a central processing unit (CPU) or a graphics processing unit (GPU). The semiconductor chip may be a high bandwidth memory (HBM).

In high performance computing system, a bottleneck phenomenon may occur because of memory devices. Accordingly, next generation high performance DRAM devices such as HBM may be employed as the semiconductor memory devices. HBM may correspond to a memory standard including a plurality of memory die which are stacked using a TSV technique to obtain a high bandwidth thereof. HBM may have a lot of input/output (I/O) pins, for example, 1024 I/O pins to broaden the memory bandwidth. Thus, an interposer may be employed in a SIP to realize the number of signal lines corresponding to the increased I/O pins.

The SIP may require a lot of interconnection lines to electrically connect a plurality of semiconductor chips to each other. Accordingly, the SIP may employ an interposer to increase the number of interconnection lines disposed in a limited area. The interposer may be fabricated using processes for forming semiconductor die. Thus, interconnection lines of the interposer may be formed to have a fine pitch less than one micrometer. Therefore, the interposer may have advantages in increasing the number of the interconnection lines disposed in a limited area. In addition, the interposer may include through electrodes (or through vias) such as TSVs that electrically connect lower interconnection lines disposed on a bottom surface of the interposer to upper interconnection lines disposed on a top surface of the interposer. Interconnection lines of the interposer may be formed to have a fine pitch less than a pitch of interconnection lines of a general package substrate such as a printed circuit board (PCB). For example, silicon interposers fabricated using a silicon wafer may be employed in the SIP packages.

Various embodiments may be directed to semiconductor packages including an interposer and electronic systems including the same.

FIG. 1 is a cross-sectional view illustrating a representation of an example of a semiconductor package 10 according to an embodiment.

Referring to FIG. 1, the semiconductor package 10 may include a first semiconductor chip 100, second semiconductor chips 200 attached to a surface of the first semiconductor chip 100, and an interposer 300 that electrically and physically (or mechanically) connects the first semiconductor chip 100 to a package substrate 400. The second semiconductor chips 200 may be mounted on the surface of the first semiconductor chip 100 and may be disposed between the package substrate 400 and the first semiconductor chip 100.

The first semiconductor chip 100 may have a size that is different from a size of each of the second semiconductor chips 200. For example, a width W2 of each of the second semiconductor chips 200 may be less than a width W1 of the first semiconductor chip 100. The first semiconductor chip 100 may be a semiconductor die in which an integrated circuit is formed or may have a package form including a semiconductor die encapsulated by a molding member. Each of the second semiconductor chips 200 may be a semiconductor die in which an integrated circuit is formed or may have a package form including a semiconductor die encapsulated by a molding member. The first semiconductor chip 100 may have a different function from the second semiconductor chips 200.

The first semiconductor chip 100 may include a logic chip having a SoC form. The first semiconductor chip 100 may include a semiconductor die in which a microprocessor, a microcontroller, a digital signal processing core, or an interface are integrated. The first semiconductor chip 100 may include such semiconductor die and a molding member for encapsulating the semiconductor die. The microprocessor may include a CPU or a GPU. The second semiconductor chips 200 may include memory devices such as DRAM devices. The second semiconductor chip 200 may include a memory chip that has a HBM scheme. The second semiconductor chip 200 may communicate with the first semiconductor chip 100. The second semiconductor chip 200 may be HBM chip.

Since the semiconductor package 10 requires a large capacity of memory, the semiconductor package 10 may has a plurality of the second semiconductor chips 200. For example, because an operation of a processor included in the first semiconductor chip 100 requires a large capacity of memory, each of the second semiconductor chips 200 may be configured to include a highly integrated DRAM chip and the second semiconductor chips 200 may be electrically connected to the first semiconductor chip 100. The second semiconductor chips 200 may be one dimensionally or two dimensionally arrayed between the first semiconductor chip 100 and the package substrate 400. In some embodiments, the second semiconductor chips 200 may include a plurality of chips having different functions or different sizes. Alternatively, the second semiconductor chips 200 may include a plurality of chips having the same function and the same size.

The width W2 of each of the second semiconductor chips 200 may be less than the width W1 of the first semiconductor chip 100. At least two or more second semiconductor chips 200 may be respectively mounted on the surface of the first semiconductor chip 100 to overlap with the first semiconductor chip 100. The second semiconductor chips 200 may be disposed on both edges of the first semiconductor chip 100 to be symmetric with respect to a central point of the first semiconductor chip 100. The semiconductor package 10 may have a balanced configuration, and interconnection lines or connection members may be evenly disposed throughout the semiconductor package 10.

The first semiconductor chip 100 may have a first region 101 and a pair of second regions 102 which are distinct from the first region 101. For example, the pair of second regions 102 may be allocated at both edges of the first semiconductor chip 100, and the first region 101 may be allocated between the pair of second regions 102. The second semiconductor chips 200 may be mounted on the second regions 102 of the first semiconductor chip 100. The first semiconductor chip 100 may have a first surface 108 and a second surface 109 that are opposite to each other, and each of the second semiconductor chips 200 may have a third surface 208 and a fourth surface 209 that are opposite to each other. Each of the second semiconductor chips 200 may be mounted on the first semiconductor chip 100 so that the fourth surface 209 faces the second surface 109 of the first semiconductor chip 100.

The second semiconductor chips 200 may be connected to the first semiconductor chip 100 through first conductive coupling members 500. First ends of the first conductive coupling members 500 may be combined with the second surface 109 of the first semiconductor chip 100, and second ends of the first conductive coupling members 500 may be combined with the fourth surfaces 209 of the second semiconductor chips 200. The second semiconductor chips 200 may be mechanically combined with and electrically connected to the first semiconductor chip 100 through the first conductive coupling members 500. For example, the first conductive coupling members 500 may correspond to inter-chip coupling members that connect the second semiconductor chips 200 to the first semiconductor chip 100. The first conductive coupling members 500 may have a size of several micrometers to several tens of micrometers. For example, each of the first conductive coupling members 500 may have a diameter which is less than 100 micrometers. The first conductive coupling members 500 may be micro bumps. The first conductive coupling members 500 may be arrayed to have a pitch of about 10 micrometers to about 100 micrometers.

The interposer 300 may be located at one side of each of the second semiconductor chips 200 and at substantially the same level as the second semiconductor chips 200. The interposer 300 may be employed as an intermediate member or an intermediate substrate that mechanically and electrically connects the first semiconductor chip 100 to the package substrate 400. The interposer 300 may be a silicon interposer including an interconnection structure. The interconnection structure may include TSVs that penetrate silicon substrate.

When a plurality of the second semiconductor chips 200 are mounted on the first semiconductor chip 100, the interposer 300 may be located at one side of each of the second semiconductor chips 200 and may be spaced apart from the second semiconductor chips 200. The interposer 300 may be disposed between the second semiconductor chips 200 mounted on both edges of the first semiconductor chip 100. That is, the interposer 300 may be disposed to overlap with the first region 101 of the first semiconductor chip 100 and interposed between the second semiconductor chips 200 which may be disposed to overlap with the second region 102 of the first semiconductor chip 100. The interposer 300 may be interposed between the first semiconductor chip 100 and the package substrate 400. The interposer 300 may act as a connection member that electrically connects the first semiconductor chip 100 to the package substrate 400. The interposer 300 may correspond to an interposer having a width W3 less than the width W1 of the first semiconductor chip 100. When the number of the second semiconductor chips 200 is two or more, the width W3 of the interposer 300 may be greater than the width W2 of the second semiconductor chips 200.

The interposer 300 may correspond to a substrate body having a fifth surface 308 and a sixth surface 309 that are opposite to each other. The sixth surface 309 of the interposer 300 may face the second surface 109 of the first semiconductor chip 100, and the fifth surface 308 of the interposer 300 may face the package substrate 400. The interposer 300 may be electrically connected to the first semiconductor chip 100 through second conductive coupling members 600. The interposer 300 may be electrically connected to the package substrate 400 through third conductive coupling members 700.

First ends of the second conductive coupling members 600 may be combined with the second surface 109 in the first region 101 of the first semiconductor chip 100, and second ends of the second conductive coupling members 600 may be combined with the sixth surface 309 of the interposer 300. The first semiconductor chip 100 may be mechanically combined with and electrically connected to the interposer 300 through the second conductive coupling members 600. That is, the second conductive coupling members 600 may connect the first semiconductor chip 100 to the interposer 300. The second conductive coupling members 600 may have a size of several micrometers to several tens of micrometers. For example, each of the second conductive coupling members 600 may have a diameter which is less than 100 micrometers. The second conductive coupling members 600 may be micro bumps. The second conductive coupling members 600 may be arrayed to have a pitch of about 10 micrometers to about 100 micrometers. Since the second conductive coupling members 600 are connected to the second surface 109 of the first semiconductor chip 100, the second conductive coupling members 600 may have substantially the same size and pitch as the first conductive coupling members 500.

The third conductive coupling members 700 may be introduced to combine the fifth surface 308 of the interposer 300 with a surface of the package substrate 400. The package substrate 400 may include a substrate body having a seventh surface 408 and an eighth surface 409 that are opposite to each other. The seventh surface 408 of the package substrate 400 may face the third surfaces 208 of the second semiconductor chips 200 and the fifth surface 308 of the interposer 300. First ends of the third conductive coupling members 700 may be combined with the fifth surface 308 of the interposer 300, and second ends of the third conductive coupling members 700 may be combined with the seventh surface 408 of the package substrate 400. The interposer 300 may be mechanically combined with and electrically connected to the package substrate 400 through the third conductive coupling members 700. That is, the third conductive coupling members 700 may connect the interposer 300 to the package substrate 400.

The third conductive coupling members 700 may have a size of several tens of micrometers to several hundreds of micrometers. The third conductive coupling members 700 may be bumps that have a diameter and a height which are greater than those of the micro bumps used as the second conductive coupling members 600. The third conductive coupling members 700 may be arrayed to have a pitch P2 which is greater than a pitch P1 of the second conductive coupling members 600. For example, the third conductive coupling members 700 may be arrayed to have a pitch of about 40 micrometers to about 400 micrometers.

The package substrate 400 may be a PCB on which a stack structure of the first and second semiconductor chips 100 and 200 are mounted. The package substrate 400 may be connected to the first semiconductor chip 100 through the interposer 300 and the second and third conductive coupling members 600 and 700. In some embodiments, the seventh surface 408 of the package substrate 400 may substantially contact on the third surface 208 of the second semiconductor chips 200. However, no conductive coupling member or no interconnection structure is disposed between the package substrate 400 and the second semiconductor chips 200. That is, the package substrate 400 may be electrically connected to the second semiconductor chips 200 through the interposer 300 and the first semiconductor chip 100, and the seventh surface 408 of the package substrate 400 may not combined with the third surfaces 208 of the second semiconductor chips 200. That is, no conductive coupling member may be disposed between chip overlap regions 408A (overlapping with the second semiconductor chips 200) of the seventh surface 408 of the package substrate 400 and the third surfaces 208 of the second semiconductor chips 200.

A plurality of fourth conductive coupling members 800 may be disposed on the eighth surface 409 of the package substrate 400 opposite to the first and second semiconductor chips 100 and 200. The semiconductor package 10 may be electrically connected to an external device or an external module through the fourth conductive coupling members 800. The fourth conductive coupling members 800 may be, for example, bumps or solder balls. The fourth conductive coupling members 800 may have a size which is greater than sizes of the first, second and third conductive coupling members 500, 600 and 700. For example, each of the fourth conductive coupling members 800 may have a diameter and a height which are greater than those of the first, second and third conductive coupling members 500, 600 and 700. Moreover, the fourth conductive coupling members 800 may be arrayed to have a pitch P3 greater than the pitches P1 and P2 of the second and third conductive coupling members 600 and 700.

Figure 2:
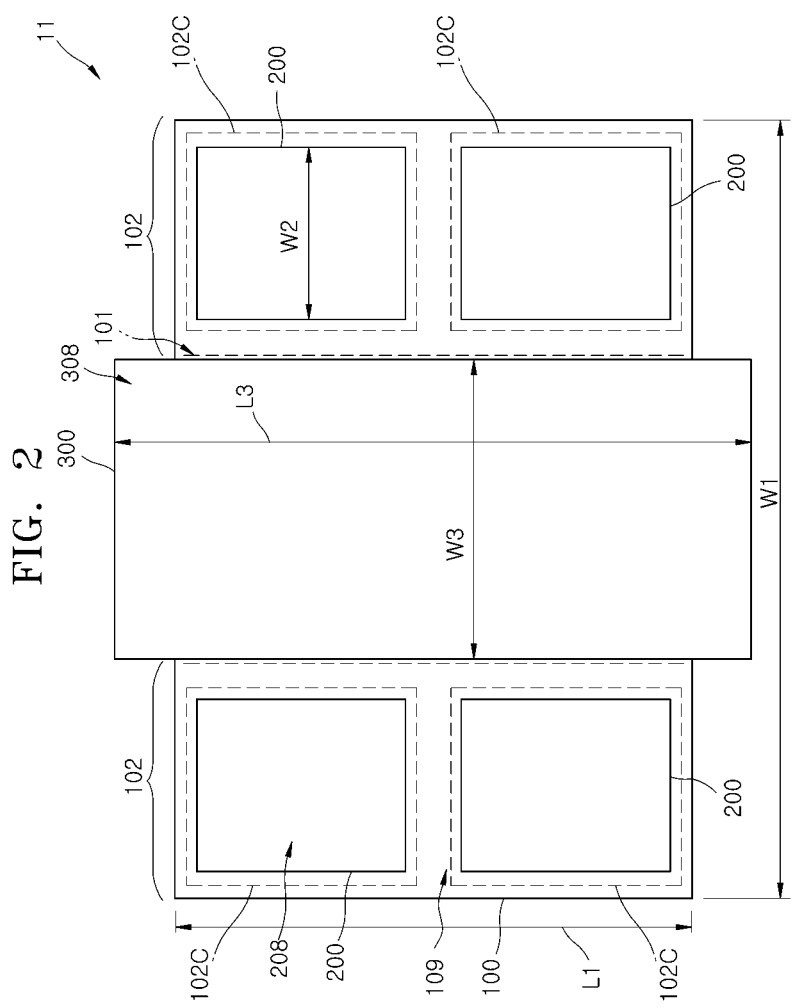
FIG. 2 is a layout diagram illustrating a representation of an example of a semiconductor package according to an embodiment.
Figure 3:
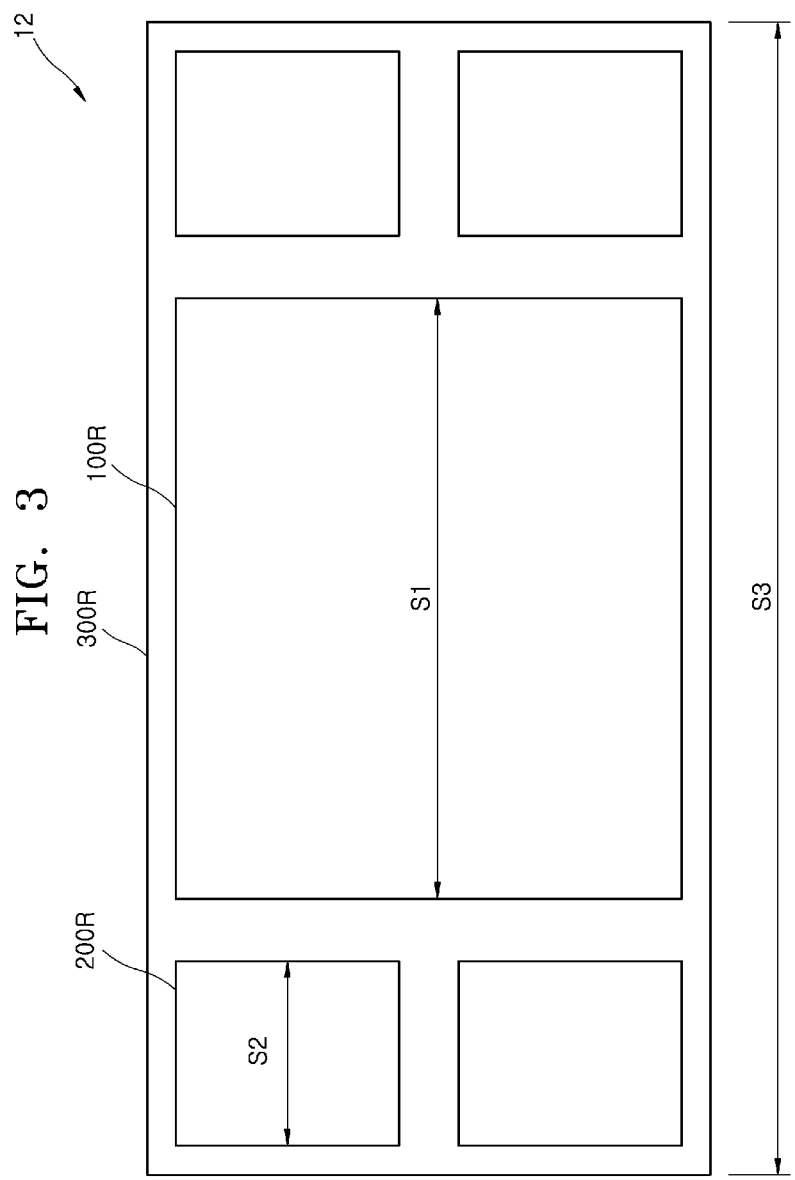
FIG. 3 is a layout diagram illustrating a representation of an example of a semiconductor package according to an embodiment.

FIG. 2 is a layout diagram illustrating a representation of an example of a semiconductor package 11 according to an embodiment, and FIG. 3 is a layout diagram illustrating a representation of an example of a semiconductor package 12 according to an embodiment.

The layout diagram of the semiconductor package 11 illustrated in FIG. 2 may correspond to a plan view of the semiconductor package 10 illustrated in FIG. 1. The semiconductor package 11 may include a stack structure of the first and second semiconductor chips 100 and 200. The second semiconductor chips 200 may be mounted on the second surface 109 of the first semiconductor chip 100. The first semiconductor chip 100 may include a first region 101 and a pair of second regions 102. Both edges of the first semiconductor chip 100 may correspond to the pair of second regions 102. A region between the second regions 102 may correspond to the first region 101. The second semiconductor chips 200 may be disposed on the second regions 102 of the first semiconductor chip 100. The first and second regions 101 and 102 may be parallel or substantially parallel with each other to have band shapes.

The second semiconductor chips 200 may be two-dimensionally arrayed on the second regions 102 of the first semiconductor chip 100 and may be spaced apart from each other. In an embodiment, the number of the second semiconductor chips 200 may be four, and the second semiconductor chips 200 may be respectively located on four corner regions 102C of the first semiconductor chip 100. As illustrated in FIG. 1, the second semiconductor chips 200 may be mounted on the first semiconductor chip 100 so that the fourth surfaces 209 of the second semiconductor chips 200 face the second surface 109 of the first semiconductor chip 100.

The second semiconductor chips 200 may be mounted on the corner regions 102C in the second regions 102 of the first semiconductor chip 100, and the interposer 300 may be disposed on the first region 101 of the first semiconductor chip 100. Thus, the width W3 of the interposer 300 may be less than the width W1 of the first semiconductor chip 100. However, a length L3 of the interposer 300 may be defined independently. The length L3 of the interposer 300 may be greater than a length L1 of the first semiconductor chip 100. If the length L3 of the interposer 300 is greater than the length L1 of the first semiconductor chip 100, it may be possible to increase a planar area of the interposer 300. However, in some embodiments, the length L3 of the interposer 300 may be equal to or less than the length L1 of the first semiconductor chip 100.

The planar area of the interposer 300 may be reduced by disposing the interposer 300 aside the second semiconductor chips 200 to overlap with the first semiconductor chip 100. The planar area of the interposer 300 may be reduced by disposing the interposer 300 between two columns along which the second semiconductor chips 200 are arrayed.

The semiconductor package 12 illustrated in FIG. 3 may be configured to include a wide interposer 300R, a third semiconductor chip 100R disposed on the interposer 300R, and fourth semiconductor chips 200R disposed on the interposer 300R to be located at both sides of the third semiconductor chip 100R. Since all of the third and fourth semiconductor chips 100R and 200R are mounted on one surface of the interposer 300R, the interposer 300R may have a width S3 which is greater than a width S1 of the third semiconductor chip 100R as well as a width S2 of the fourth semiconductor chips 200R. According to the semiconductor package 11 illustrated in FIG. 2, the second semiconductor chips 200 may be mounted on the corner regions 102C in the second regions 102 of the first semiconductor chip 100, and the interposer 300 may be disposed to overlap with the first region 101 of the first semiconductor chip 100 between the second semiconductor chips 200. The width W3 of the interposer 300 illustrated in FIG. 2 may less than the width S3 of the interposer 300R illustrated in FIG. 3. That is, when the size of the first semiconductor chip 100 illustrated in FIG. 2 and the size of the third semiconductor chip 100R illustrated in FIG. 3 are substantially same, and the size of the second semiconductors chip 200 illustrated in FIG. 2 and the size of the fourth semiconductor chips 200R illustrated in FIG. 3 are substantially same, the size requirement of interposer 300 in FIG. 2 may less than the size requirement of interposer 300R in FIG. 3.

The semiconductor package 11 may have a reduced size as compared with the semiconductor package 12. This is because the interposer 300 and the second semiconductor chips 200 are mounted on the first semiconductor chip 100 while the first and second semiconductor chips 100R and 200R are mounted on the interposer 300R.

Figure 4:
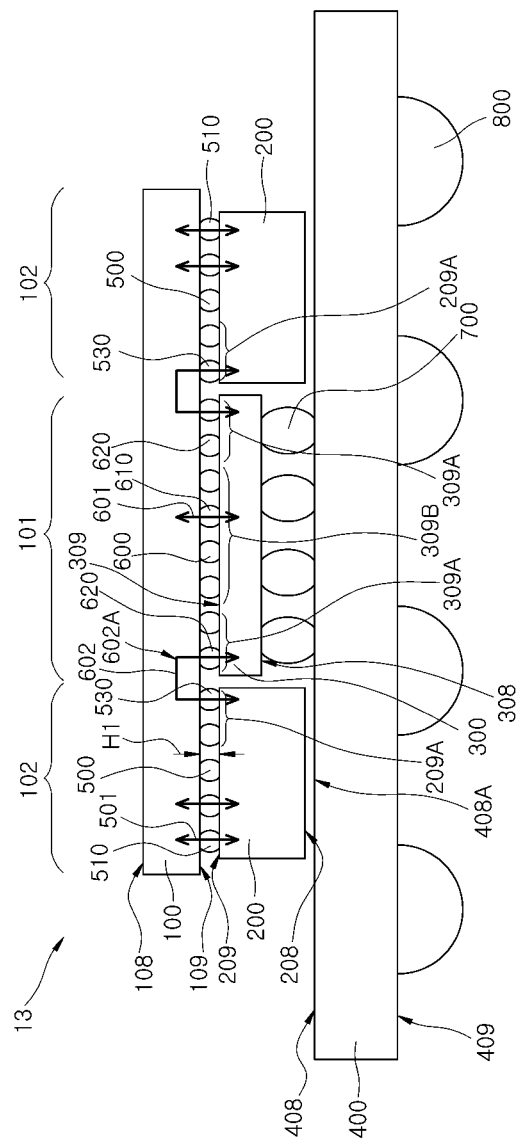
FIG. 4 is a cross-sectional view illustrating a representation of an example of a semiconductor package according to an embodiment.

FIG. 4 is a cross-sectional view illustrating a representation of an example of a semiconductor package 13 according to an embodiment.

Referring to FIG. 4, the semiconductor package 13 may be configured to include the first semiconductor chip 100 and the second semiconductor chips 200 having a different size from the first semiconductor chip 100. The second semiconductor chips 200 may be mechanically combined with the first semiconductor chip 100 by the first conductive coupling members 500. The first conductive coupling members 500 may be disposed between the first semiconductor chip 100 and the second semiconductor chips 200. The first conductive coupling members 500 may include a first group of first conductive coupling members 510 and a second group of first conductive coupling members 530. First ends of the first and second groups of first conductive coupling members 510 and 530 may be combined with the second surface 109 of the first semiconductor chip 100. Second ends of the first and second groups of first conductive coupling members 510 and 530 may be combined with the fourth surfaces 209 of the second semiconductor chips 200.

The first group of first conductive coupling members 510 may be introduced to provide first electric signal paths 501 between the first semiconductor chip 100 and the second semiconductor chips 200. For example, electric signal transmission between the first semiconductor chip 100 and the second semiconductor chips 200 may be performed through the first electric signal paths 501. For example, the first group of first conductive coupling members 510 may electrically connect a microprocessor or a microcontroller in the first semiconductor chip 100 to memory devices in the second semiconductor chips 200.

Since the second semiconductor chips 200 are disposed to overlap with portions (i.e., the second regions 102) of the first semiconductor chip 100, a length of the first electric signal paths 501 may be minimized because the first group of first conductive coupling members 510 is disposed between the first semiconductor chip 100 and the second semiconductor chips 200 without additional electrical path such as redistribution layers. Thus, a signal integration of the semiconductor package 13 may be improved. Each length of the first electric signal paths 501 depends on a height H1 of the first group of first conductive coupling members 510.

Figure 5:
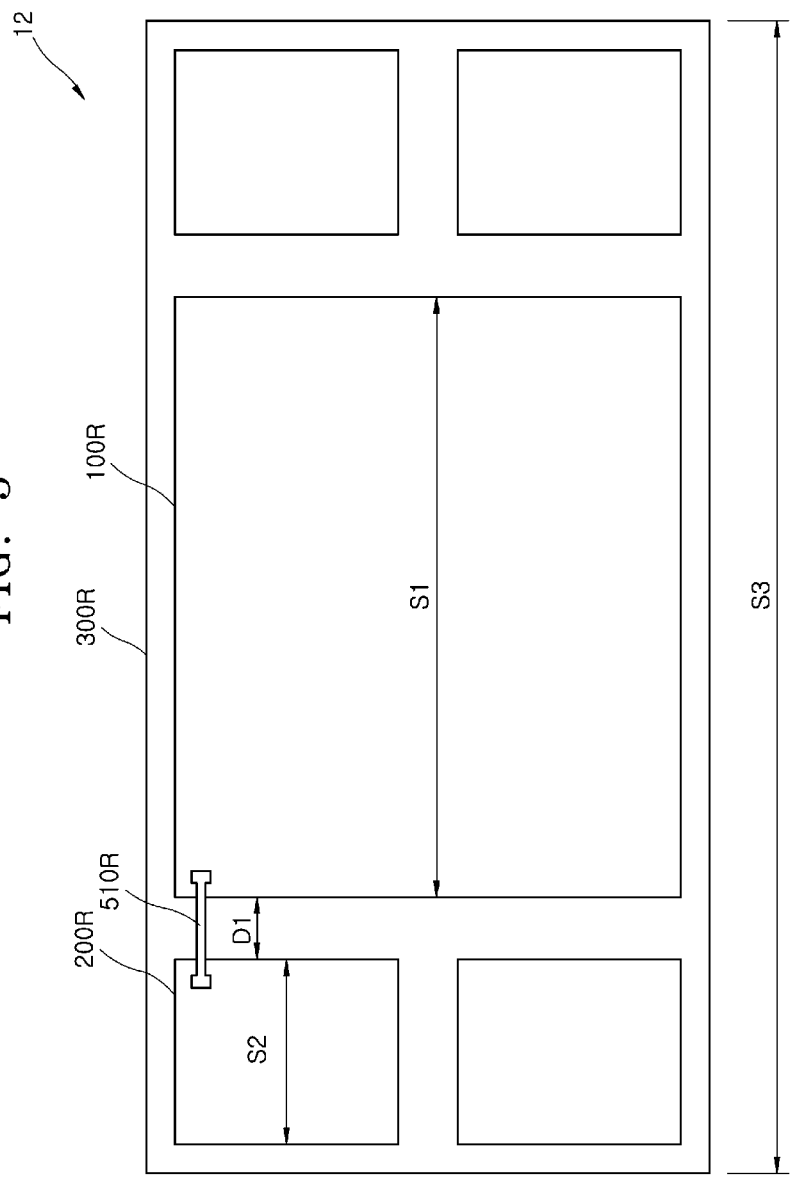
FIG. 5 is a layout diagram illustrating a representation of an example of the semiconductor package of FIG. 3 together with an extension line included therein.

Referring to FIG. 5, if the fourth semiconductor chips 200R (corresponding to the second semiconductor chips 200) are disposed aside the third semiconductor chip 100R (corresponding to the first semiconductor chip 100), an extension line 510R for coupling the third semiconductor chip 100R with each of the fourth semiconductor chips 200R may be disposed to electrically connect the third semiconductor chip 100R to each of the fourth semiconductor chips 200R and to compensate for a distance D1 between the third semiconductor chip 100R and each of the fourth semiconductor chips 200R. The extension line 510R may be disposed in an interconnection line form on or in the interposer 300R, as illustrated in FIG. 5.

FIG. 5 is a layout diagram illustrating a representation of an example of the semiconductor package 12 of FIG. 3 together with the extension line 510R included therein. The extension line 510R has to extend to have a length greater than the distance D1 between the third semiconductor chip 100R and each of the fourth semiconductor chips 200R. Because the electric signal path between third semiconductor chip 100R and the fourth semiconductor chips 200R includes the extension line 510R, a length of the electric signal path between third semiconductor chip 100R and the fourth semiconductor chips 200R is greater than a length of the electric signal path between the first semiconductor chip 100 and the second semiconductor chip 200 in FIG. 4. Accordingly, a signal integration of the semiconductor package 12 illustrated in FIG. 5 may be degraded as compared with the semiconductor package 13 illustrated in FIG. 4.

Figure 6:
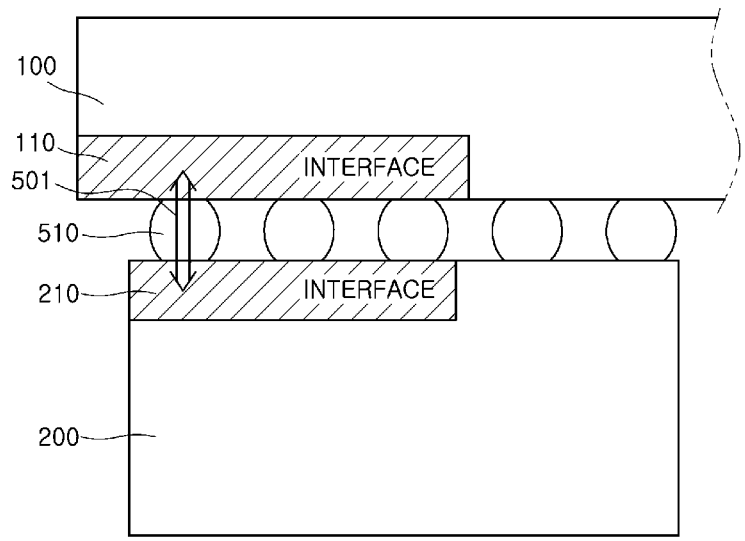
FIGS. 6 and 7 are schematic views illustrating a representation of an example of signal transmission paths between semiconductor chips included in a semiconductor package according to an embodiment.

FIG. 6 illustrates a representation of an example of a signal transmission path between the first semiconductor chip 100 and one of the second semiconductor chips 200 included in the semiconductor package 10 or 13.

Referring to FIG. 6, the first semiconductor chip 100 may include a first interface 110 for networking, and the second semiconductor chip 200 may also include a second interface 210 for networking. In order to reduce a length of electric signal paths (i.e., signal transmission paths) between the first semiconductor chip 100 and the second semiconductor chip 200, the second semiconductor chip 200 may be disposed to overlap with the first semiconductor chip 100 so that the second interface 210 faces the first interface 110. For example, the second semiconductor chip 200 may be mounted on the first semiconductor chip 100 so that a physical layer (a PHY region) of the second semiconductor chip 200 faces a PHY region of the first semiconductor chip 100. Accordingly, since the PHY region of the second semiconductor chip 200 can be connected to the PHY region of the first semiconductor chip 100 through only the first group of first conductive coupling members 510, a length of the first electric signal paths 501 may be minimized to realize fast communication between the first semiconductor chip 100 and the second semiconductor chip 200.

Figure 7:
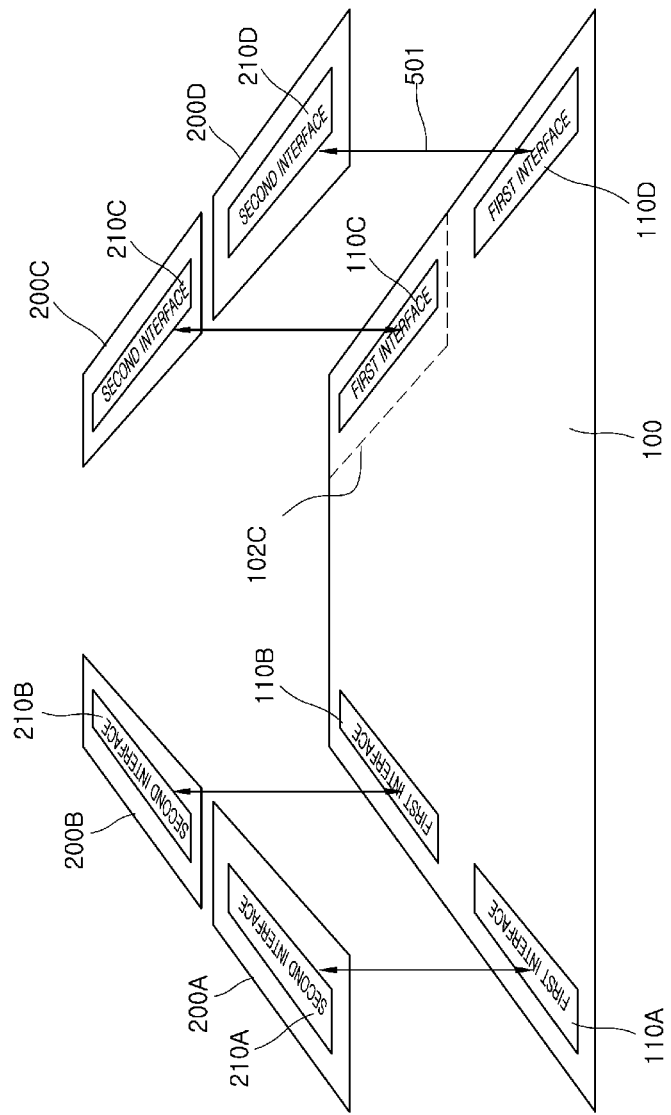

FIG. 7 illustrates a representation of an example of signal transmission paths between the first semiconductor chip 100 and the plurality of the second semiconductor chips 200 included in the semiconductor package 10 or 13.

Referring to FIG. 7, if the second semiconductor chips 200 include four second semiconductor chips 200A, 200B, 200C and 200D, the four second semiconductor chips 200A, 200B, 200C and 200D may be respectively disposed on four corner regions of the first semiconductor chip 100. In such an example, the second semiconductor chips 200A, 200B, 200C and 200D may respectively include second interfaces 210A, 210B, 210C and 210D, and the first semiconductor chip 100 may include first interfaces 110A, 110B, 110C and 110D disposed to respectively correspond to the second interfaces 210A, 210B, 210C and 210D. As a result, the first interfaces 110A, 110B, 110C and 110D may also be disposed in four corner regions of the first semiconductor chip 100, respectively. Thus, the first interfaces 110A, 110B, 110C and 110D may be connected to the second interfaces 210A, 210B, 210C and 210D through the four first electric signal paths 501 having a reduced length, respectively. The four first electric signal paths 501 may have substantially the same length.

The second semiconductor chips 200A, 200B, 200C and 200D may be disposed to be point symmetric with respect to a central point of the first semiconductor chip 100 in a plan view. Thus, the first and second semiconductor chips 100, 200A, 200B, 200C and 200D may be disposed to have a balanced configuration and to provide optimum characteristics of the semiconductor package 10 or 13.

Referring again to FIG. 4, the second group of first conductive coupling members 530 may also be interposed between the first semiconductor chip 100 and the second semiconductor chips 200 to combine the second surface 109 of the first semiconductor chip 100 with the fourth surfaces 209 of the second semiconductor chips 200. Each of the second group of first conductive coupling members 530 may correspond to a portion of one of second electric signal paths 602 that electrically connect the interposer 300 to the second semiconductor chips 200. Each of the second electric signal paths 602 may be a path that connects the interposer 300 to one of the second semiconductor chips 200 through a portion of the second surface 109 of the first semiconductor chip 100.

Each of the second group of first conductive coupling members 530 may correspond to a portion of any one of the second electric signal paths 602. In addition, each of the second electric signal paths 602 may include an intermediate path 602A disposed at the second surface 109 of the first semiconductor chip 100. Although the intermediate paths 602A are disposed at the second surface 109 of the first semiconductor chip 100, the intermediate paths 602A may be substantially insulated from the first semiconductor chip 100. Thus, the second group of first conductive coupling members 530 may be disposed on predetermined regions of the fourth surfaces 209 of the second semiconductor chips 200, which are distinct from the regions on which the first group of first conductive coupling members 510 is disposed. The second group of first conductive coupling members 530 does not electrically connect the first semiconductor chip 100 to the second semiconductor chips 200, unlike the first group of first conductive coupling members 510. Accordingly, the second semiconductor chips 200 may not be electrically connected to the first semiconductor chip 100 through the second group of first conductive coupling members 530. Thus, the second semiconductor chips 200 may not directly communicate with the first semiconductor chip 100 through the second group of first conductive coupling members 530. Although the second group of first conductive coupling members 530 are employed to constitute the second electric signal paths 602 that is different from the first electric signal paths 501 comprised of the first group of first conductive coupling members 510, the second group of first conductive coupling members 530 may be substantially the same shape or structure as the first group of first conductive coupling members 510. For example, the first and second groups of first conductive coupling members 510 and 530 may be micro bumps with substantially same size.

Referring to FIG. 4, the second conductive coupling members 600 may be disposed between the interposer 300 and the first semiconductor chip 100 to constitute the second electric signal paths 602 that electrically connect the interposer 300 to the first semiconductor chip 100. The second conductive coupling members 600 may include a first group of second conductive coupling members 610 and a second group of second conductive coupling members 620. First ends of the first and second groups of second conductive coupling members 610 and 620 may be combined with the second surface 109 in the first region 101 of the first semiconductor chip 100. Second ends of the first and second groups of second conductive coupling members 610 and 620 may be combined with the sixth surface 309 of the interposer 300.

The second group of first conductive coupling members 530 may be disposed on first regions 209A of the fourth surfaces 209 of the second semiconductor chips 200, which are adjacent to the interposer 300. The second group of second conductive coupling members 620 may be disposed on predetermined regions of the sixth surface 309 of the interposer 300, which are distinct from the regions on which the first group of second conductive coupling members 610 is disposed. For example, the second group of second conductive coupling members 620 may be disposed on first regions 309A of the sixth surface 309 of the interposer 300, which are adjacent to the first regions 209A of the fourth surfaces 209 of the second semiconductor chips 200. In contrast, the first group of second conductive coupling members 610 may be disposed on a second region 309B of the sixth surface 309 of the interposer 300, which is located at a central region of the interposer 300. If the second semiconductor chips 200 are disposed at both sides of the interposer 300, the first regions 309A of the sixth surface 309 of the interposer 300 may correspond to both edges of the interposer 300 and the second region 309B of the sixth surface 309 of the interposer 300 may be located between the first regions 309A.

Each of the second groups of second conductive coupling members 620 disposed on the first regions 309A of the sixth surface 309 of the interposer 300 may constitute a portion of one of the second electric signal paths 602. For example, the second group of second conductive coupling members 620 may be connected to the intermediate paths 602A disposed at the second surface 109 of the first semiconductor chip 100. Since the second group of second conductive coupling members 620 are disposed on the first regions 309A of the sixth surface 309 of the interposer 300 to be adjacent to the first regions 209A of the fourth surfaces 209 of the second semiconductor chips 200, a length of the intermediate paths 602A may be reduced as compared with an example where the second group of second conductive coupling members 620 are disposed on the second region 309B of the sixth surface 309 of the interposer 300. As such, a length of the second electric signal paths 602 may be reduced to improve a signal transmission speed between the interposer 300 and the second semiconductor chips 200.

Referring to FIG. 4, the first group of second conductive coupling members 610 may be disposed on a second region 309B of the sixth surface 309 of the interposer 300. The first group of second conductive coupling members 610 may be connected to the second surface 109 in the first region 101 of the first semiconductor chip 100 to provide third electric signal paths 601 that connect the interposer 300 to the first semiconductor chip 100. For example, the first semiconductor chip 100 may be electrically connected to and mechanically combined with the interposer 300 by the first group of second conductive coupling members 610. Although the first group of second conductive coupling members 610 are employed to constitute the third electric signal paths 601 different from the second electric signal paths 602 comprised of the second group of second conductive coupling members 620, the first group of second conductive coupling members 610 may be substantially the same shape or structure as the second group of second conductive coupling members 620. For example, the first and second groups of second conductive coupling members 610 and 620 may be micro bumps with substantially same size.

Figure 8:
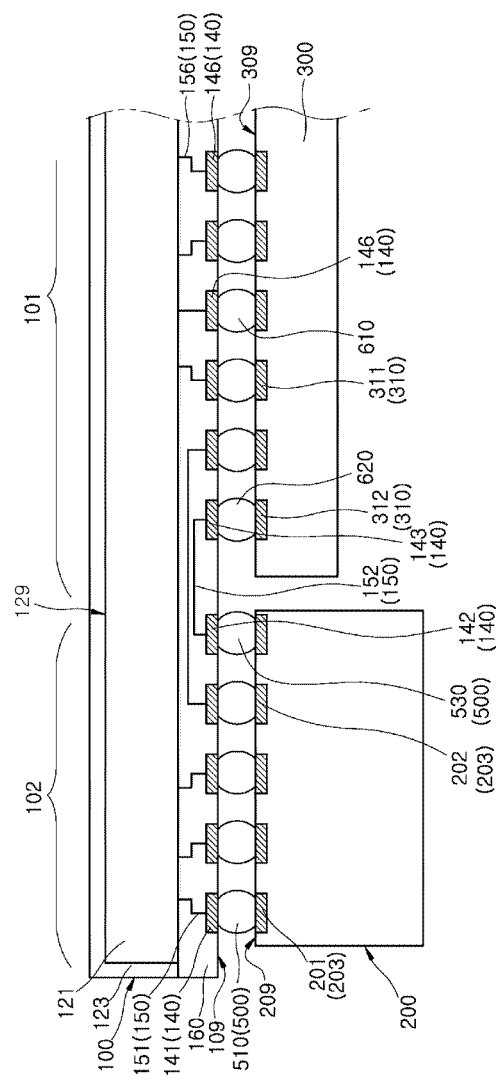
FIG. 8 is a cross-sectional view illustrating a representation of an example of an interconnection structure of a semiconductor package according to an embodiment.

FIG. 8 is a cross-sectional view illustrating a representation of an example of an interconnection structure of the semiconductor package 13 illustrated in FIG. 4.

Referring to FIGS. 4 and 8, the first conductive coupling members 500 may be disposed to mechanically and electrically connect the second semiconductor chips 200 to the first semiconductor chip 100. First ends of the first conductive coupling members 500 may be combined with the first contact portions 140 disposed on the second surface 109 of the first semiconductor chip 100. Second ends of the first conductive coupling members 500 may be combined with second contact portions 203 disposed on the fourth surface 209 of the second semiconductor chips 200. The first contact portions 140 may include a first group of first contact portions 141 and a second group of first contact portions 142. The second group of first contact portions 142 may be disposed to face the first regions 209A of the second semiconductor chips 200.

The first group of first conductive coupling members 510 may be combined with the first group of first contact portions 141, respectively. The first group of first contact portions 141 may be connected to a first group of first internal interconnection lines 151 penetrating a dielectric layer 160 disposed along the second surface 109 of the first semiconductor chip 100. The first group of first internal interconnection lines 151 may be electrically connected to a first semiconductor die 121 included in the first semiconductor chip 100. The first group of first internal interconnection lines 151 may be electrically insulated or physically separated from other first internal interconnection lines 150 by the dielectric layer 160. The first semiconductor chip 100 may include the dielectric layer 160 in which the first internal interconnection lines 150 are disposed and the first semiconductor die 121 that is electrically connected to an external device (not illustrated) through the first internal interconnection lines 150. The first semiconductor die 121 may be a semiconductor die such as a microprocessor or a microcontroller in which a logic circuit is integrated. The first semiconductor die 121 may be encapsulated by a first protection layer 123 such as, for example but not limited to, epoxy molding compound (EMC). Although FIG. 8 illustrates an example in which the first protection layer 123 covers a top surface 129 (substantially, corresponding to a backside surface) of the first semiconductor die 121, the present disclosure is not limited thereto. For example, in some embodiments, the first protection layer 123 may be disposed to expose the top surface 129 of the first semiconductor die 121. In such an example, heat generated in the first semiconductor die 121 may be more readily emitted out of the first semiconductor chip 100.

The first internal interconnection lines 150 may include an interconnection structure that is comprised of one or two conductive layers disposed in the dielectric layer 160 and interconnection vias electrically connecting the conductive layers to each other. Each of the first group of first internal interconnection lines 151 included in the first internal interconnection lines 150 may correspond to a portion of one of the first electric signal paths 501 (see FIG. 4) between the first semiconductor chip 100 (actually, the first semiconductor die 121) and the second semiconductor chips 200.

The first group of first conductive coupling members 510 combined with the first group of first contact portions 141 may also be combined with a first group of second contact portions 201 included in the second contact portions 203 disposed on the fourth surface 209 of the second semiconductor chips 200. The second contact portions 203 may include the first group of second contact portions 201 and a second group of second contact portions 202. The first group of second contact portion 201, the first group of first conductive coupling member 510, the first group of first contact portion 141, and the first group of first internal interconnection line 151, which are connected in series, may constitute any one of the first electric signal paths 501 illustrated in FIG. 4.

The second group of first contact portions 142 may be electrically connected to second group of first internal interconnection lines 152 included in the first internal interconnection lines 150. The second group of first conductive coupling members 530 combined with the second group of first contact portions 142 may also be combined with the second group of second contact portions 202. The first and second groups of second contact portions 201 and 202 may act as an external terminal of the second semiconductor chips 200. The first and second groups of second contact portions 201 and 202 may be conductive pads having substantially the same shape and size.

The second group of first internal interconnection lines 152 may be disposed in the dielectric layer 160 and may be electrically insulated or separated from the first semiconductor die 121 by the dielectric layer 160. The second group of first internal interconnection lines 152 may be connected to third group of first contact portions 143 that are located at different positions from the second group of first contact portions 142. The second group of first internal interconnection lines 152 may correspond to redistribution lines that electrically connect the second group of first contact portions 142 to the third group of first contact portions 143.

While the first and second groups of first contact portions 141 and 142 are disposed on the dielectric layer 160 in the second regions 102 of the first semiconductor chip 100 overlapping with the second semiconductor chips 200, the third group of first contact portions 143 may be disposed on the dielectric layer 160 in the first region 101 of the first semiconductor chip 100 overlapping with the interposer 300. The second group of first internal interconnection lines 152 may be extension lines or redistribution lines connecting the second group of first contact portions 142 in the second regions 102 to the third group of first contact portions 143 in the first region 101. The second group of first internal interconnection lines 152 may be disposed on or in the dielectric layer 160 to be separated from each other and may be located at different levels.

The third group of first contact portions 143 may be combined with first ends of the second group of second conductive coupling members 620. Second ends of the second group of second conductive coupling members 620 may be combined with second group of third contact portions 312 included in third contact portions 310 disposed on the sixth surface 309 of the interposer 300. The second group of second conductive coupling members 620 may electrically connect the interposer 300 to the second group of first internal interconnection lines 152. Thus, the interposer 300 may be electrically connected to the second semiconductor chips 200 through the second group of second conductive coupling members 620.

The second group of second conductive coupling member 620, the second group of third contact portion 312, the third group of first contact portion 143, the second group of first internal interconnection line 152, the second group of first contact portion 142, the second group of first conductive coupling member 530, and the second group of second contact portion 202, which are connected in series, may constitute any one of the second electric signal paths 602 illustrated in FIG. 4. The interposer 300 may be electrically connected to the second semiconductor chips 200 through the second electric signal paths 602 including the second group of first internal interconnection lines 152 that are not electrically connected to the first semiconductor die 121. Although the second group of first internal interconnection lines 152, the second group of first contact portions 142 and the third group of first contact portions 143 are disposed in or on the first semiconductor chip 100, the second electric signal paths 602 including the second group of first internal interconnection lines 152, the second group of first contact portions 142 and the third group of first contact portions 143 may be used merely as signal transmission paths between the interposer 300 and the second semiconductor chips 200.

First group of third contact portions 311 included in the third contact portions 310 may be disposed on the sixth surface 309 of the interposer 300 to be distinct from the second group of third contact portion 312. The interposer 300 may be electrically connected to a device such as the first semiconductor chip 100 through the first group of third contact portions 311. The first and second groups of third contact portions 311 and 312 may be conductive pads having substantially the same shape and size. The first group of second conductive coupling members 610 having first ends combined with the first group of third contact portions 311 may be disposed between the interposer 300 and the first region 101 of the first semiconductor chip 100. Second ends of the first group of second conductive coupling members 610 may be combined with a fourth group of first contact portions 146 included in the first contact portions 140. Accordingly, the first group of second conductive coupling members 610 may electrically connect the interposer 300 to the first semiconductor chip 100.

The fourth group of first contact portions 146 may be connected to a third group of first internal interconnection lines 156 penetrating the dielectric layer 160. The third group of first internal interconnection lines 156 may be electrically connected to the first semiconductor die 121 included in the first semiconductor chip 100. The third group of first internal interconnection lines 156 may be electrically insulated or physically separated from other first internal interconnection lines 150 by the dielectric layer 160, like the first group of first internal interconnection line 151. Since the third group of first internal interconnection lines 156 are electrically connected to the first group of second conductive coupling members 610, the interposer 300 may be electrically connected to the first semiconductor die 121. The third group of first internal interconnection line 156, the fourth group of first contact portion 146, the first group of second conductive coupling member 610 and the first group of third contact portion 311, which are connected in series, may constitute any one of the third electric signal paths 601 that electrically connect the interposer 300 to the first semiconductor chip 100, as illustrated in FIG. 4.

The first, second and third groups of first internal interconnection lines 151, 152 and 156 included in the first internal interconnection lines 150 are disposed on three different regions of the dielectric layer 160 of the first semiconductor chip 100, respectively. The second semiconductor chips 200 may be directly connected to the first semiconductor chip 100, and the interposer 300 may also be directly connected to the first semiconductor chip 100. The interposer 300 may be electrically connected to the second semiconductor chips 200 through electrical paths including the second group of first internal interconnection lines 152. Even though the interposer 300 and the second semiconductor chips 200 are disposed side-by-side on one surface of the first semiconductor chip 100, the interposer 300 may be electrically connected to the second semiconductor chips 200 through the second group of first internal interconnection lines 152.

Figure 9:
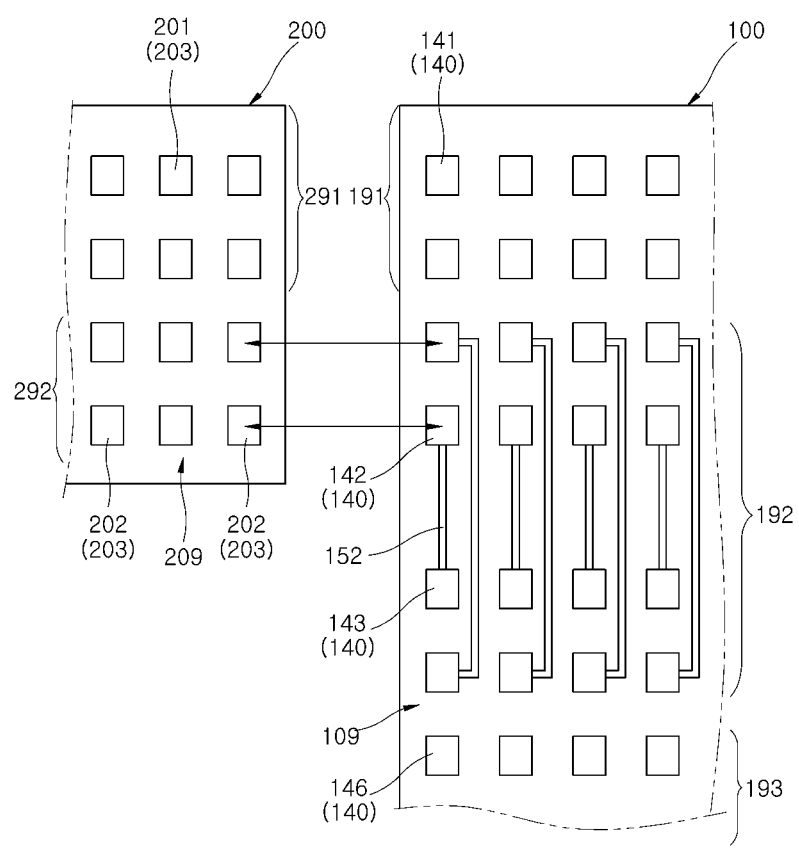
FIG. 9 is a layout diagram illustrating a representation of an example of an array of contact portions of a semiconductor chip included in a semiconductor package according to an embodiment.

FIG. 9 is a layout diagram illustrating a representation of an example of arrays of the first and second contact portions 140 and 203 illustrated in FIG. 8.

Referring to FIG. 9, the second contact portions 203 may be disposed on the fourth surface 209 of the second semiconductor chip 200. The first group of second contact portions 201 and the second group of second contact portions 202 may be disposed on a first contact region 291 and a second contact region 292 of the fourth surface 209 of the second semiconductor chip 200, respectively. A first contact region 191 of the second surface 109 of the first semiconductor chip 100 may be set to correspond to the first contact region 291, and the first group of first contact portions 141 may be arrayed on the first contact region 191 to correspond to the first group of second contact portions 201. For example, the first group of first contact portions 141 may be arrayed to vertically overlap with the first group of second contact portions 201, as illustrated in FIG. 8.

A second contact region 192 of the second surface 109 of the first semiconductor chip 100 may be set to be adjacent to the first contact region 191. The second group of first contact portions 142 may be arrayed on the second contact region 192 to correspond to the second group of second contact portions 202. For example, the second group of first contact portions 142 may be arrayed to vertically overlap with the second group of second contact portions 202, as illustrated in FIG. 8. The third group of first contact portions 143 may be disposed on the second contact region 192 to be spaced apart from the second group of first contact portions 142. The third group of first contact portions 143 may be arrayed to vertically overlap with the second group of third contact portions 312 of the interposer 300, as illustrated in FIG. 8. The second group of first internal interconnection lines 152 may be disposed in the second contact region 192 between the second group of first contact portions 142 and the third group of first contact portions 143 to electrically connect the second group of first contact portions 142 to the third group of first contact portions 143.

A third contact region 193 of the second surface 109 of the first semiconductor chip 100 may be set to be adjacent to the second contact region 192. The fourth group of first contact portion 146 may be disposed on the third contact region 193. The fourth group of first contact portion 146 may be arrayed to vertically overlap with the first group of third contact portions 311 of the interposer 300, as illustrated in FIG. 8.

Figure 10:
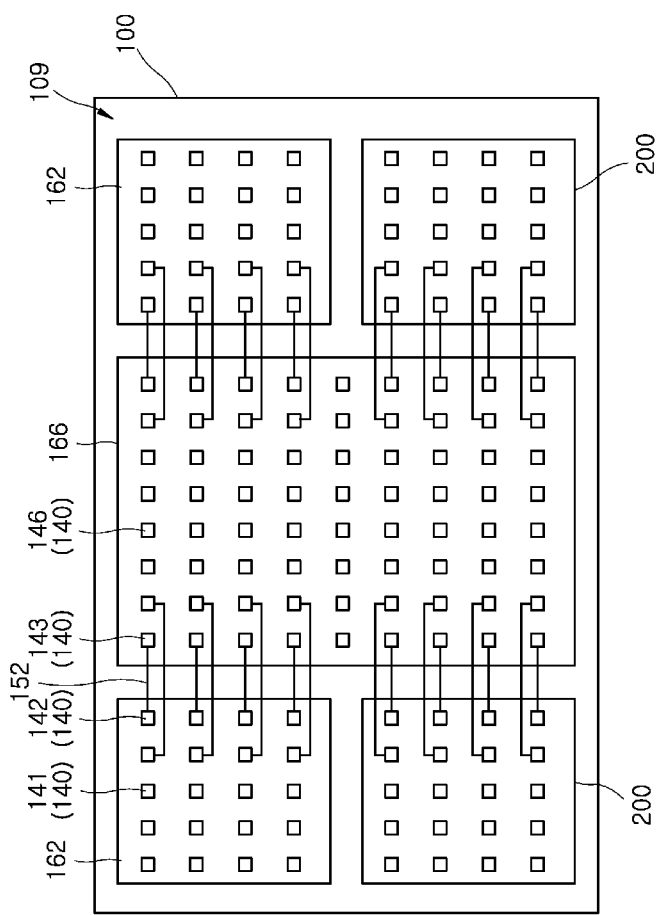
FIG. 10 is a layout diagram illustrating a representation of an example of an array of first contact portions of a first semiconductor chip included in a semiconductor package according to an embodiment.

FIG. 10 is a layout diagram illustrating a representation of an example of an array of the first contact portions 140 of the first semiconductor chip 100 illustrated in FIGS. 8 and 9.

Referring to FIG. 10, the first contact portions 141, 142, 143 and 146 may be arrayed on the second surface 109 of the first semiconductor chip 100 to act as external terminals of the first semiconductor chips 100. Referring to FIG. 9, the first and second groups of first contact portions 141 and 142 may be arrayed to correspond to the second contact portions 203 of the second semiconductor chips 200. The first and second groups of first contact portions 141 and 142 may be disposed on first overlap regions 162 corresponding to portions of the second surface 109 of the first semiconductor chip 100. Each of the first overlap regions 162 may be a region that substantially overlaps with any one of the second semiconductor chips 200. Referring to FIG. 8 with FIG. 10, the third group of first contact portions 143 and the fourth group of first contact portion 146 may be disposed on a second overlap region 166 corresponding to a portion of the second surface 109 of the first semiconductor chip 100 to overlap with the third contact portions 310 of the interposer 300. The second overlap region 166 may be a region that substantially overlaps with the interposer (i.e., 300 of FIG. 8).

If the first overlap regions 162 are respectively disposed at four corner regions of the first semiconductor chip 100, the first and second groups of first contact portions 141 and 142 may be disposed in each of the first overlap regions 162 separately. The second overlap region 166 may be set to be located at a central region of the first semiconductor chip 100 and may extend in a direction crossing the first semiconductor chip 100 to have a band shape. The third group of first contact portions 143 may be disposed on both edges of the second overlap region 166 to be adjacent to the second group of first contact portions 142 of the first semiconductor chip 100. The fourth group of first contact portion 146 may be disposed on the center portion of the second overlap region 166. The fourth group of first contact portion 146 may be disposed between a left half portion and a right half portion of the third group of first contact portions 143.

Figure 11:
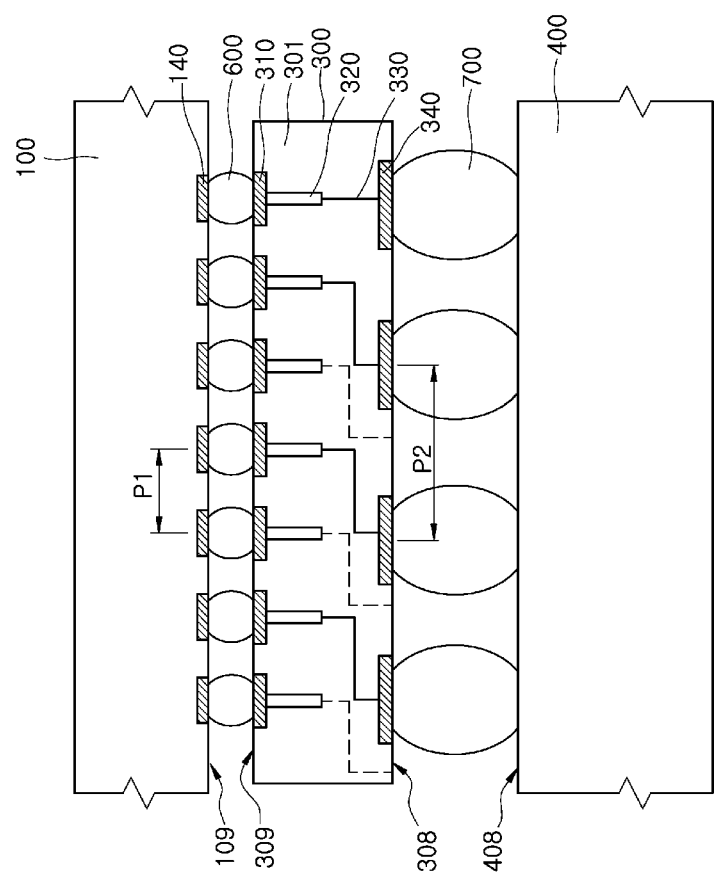
FIG. 11 is a cross-sectional view illustrating a representation of an example of an interposer of a semiconductor package according to an embodiment.

FIG. 11 is a cross-sectional view illustrating a representation of an example of the package substrate 400, the interposer 300 and the first semiconductor chip 100 included in the semiconductor package 10 or 13 illustrated in FIG. 1 or 4.

Referring to FIG. 11, the interposer 300 combined with the first semiconductor chip 100 by the second conductive coupling members 600 may include an interposer body 301. The sixth surface 309 of the interposer body 301 may face the second surface 109 of the first semiconductor chip 100. The third contact portions 310 disposed on the sixth surface 309 of the interposer body 301 may be conductive pads which are combined with the second conductive coupling members 600. The third contact portions 310 may be connected to the first contact portions 140 of the first semiconductor chip 100 through the second conductive coupling members 600, respectively. The third contact portions 310 may be disposed to substantially overlap with the first contact portions 140 corresponding thereto, respectively. Thus, a pitch of the first contact portions 140 may be substantially equal to a pitch of the third contact portions 310. Since the second conductive coupling members 600 are disposed between the third contact portions 310 and the first contact portions 140, a pitch P1 of the second conductive coupling members 600 may also be equal to the pitch of the third contact portions 310 or the first contact portions 140.

The first contact portions 140 may be disposed on the second surface 109 of the first semiconductor chip 100. The first contact portions 140 may be formed using processes that are performed at a wafer level. Each of the first contact portions 140 may be formed to have a pad shape with several micrometers to several tens of micrometers width. Since the first contact portions 140 are formed to have such a fine size, several hundred or several thousands of the first contact portions 140 may be formed in a limited area of the first semiconductor chip 100. The first contact portions 140 may be formed to have the pitch P1 greater than several micrometers and less than 100 micrometers. A PCB may be employed as the package substrate 400. In such an example, it may be difficult to form fine circuit interconnection lines which can be directly combined with the second conductive coupling members 600 having the pitch P1 on the package substrate 400. Thus, the interposer 300 such as a silicon interposer may be introduced to provide the third contact portions 310 that have a fine pitch less than 100 micrometers to directly contact the second conductive coupling members 600. The silicon interposer 300 including the third contact portions 310 may be fabricated by applying semiconductor device fabrication processes to a silicon wafer. Thus, the third contact portions 310 may be realized to have a fine pitch, that is, the pitch P1.

Fourth contact portions 340 electrically connected to the third contact portions 310 may be disposed on the fifth surface 308 of the interposer 300 (i.e., the interposer body 301) opposite to the first semiconductor chip 100. The third conductive coupling members 700 may be combined with or attached to the fourth contact portions 340 to electrically connect the interposer 300 to the package substrate 400. The third conductive coupling members 700 may be bumps having a size which is greater than a size of the second conductive coupling members 600. The fourth contact portions 340 and the third conductive coupling members 700 combined with the fourth contact portions 340 may be arrayed to have a pitch P2 which is greater than the pitch P1. The fourth contact portions 340 and the third conductive coupling members 700 may be formed to have the pitch P2 so that the third conductive coupling members 700 can be directly combined with circuit interconnection patterns realized on the package substrate 400 using a PCB technology. As a result, the third conductive coupling members 700 may electrically connect the interposer 300 to the package substrate 400. That is, the interposer 300 may include the third contact portions 310 disposed on the sixth surface 309 to have the pitch P1 and the fourth contact portions 340 disposed on the fifth surface 308 to have the pitch P2 different from the pitch P1. Thus, the interposer 300 may function as an intermediate member that electrically connects the first semiconductor chip 100 to the package substrate 400.

The third contact portions 310 may be electrically connected to the fourth contact portions 340 through second internal interconnection lines 320 and 330 that substantially penetrate the interposer body 301. The second internal interconnection lines 320 and 330 may include a first group of second internal interconnection lines 320 and a second group of second internal interconnection lines 330. The first group of second internal interconnection lines 320 may correspond to first through electrodes having a through silicon via (TSV) shape, and the second group of second internal interconnection lines 330 may correspond to restribution lines including conductive vias that electrically connect the first through electrodes 320 to the fourth contact portions 340. The first through electrodes 320 may also be connected to the third contact portions 310. In some embodiments, the second group of second internal interconnection lines 330 may be disposed to be directly combined with the third contact portions 310, and the first through electrodes 320 may be disposed to be directly combined with the fourth contact portions 340.

Figure 12:
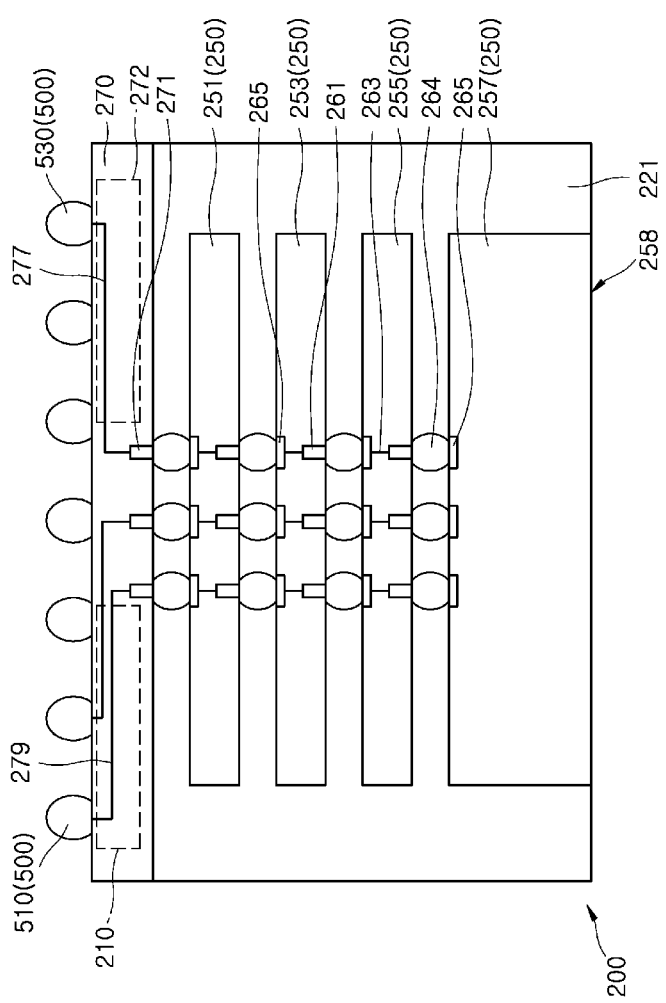
FIG. 12 is a cross-sectional view illustrating a representation of an example of a second semiconductor chip included in a semiconductor package according to an embodiment.

FIG. 12 is a cross-sectional view illustrating a representation of an example of the second semiconductor chip 200 included in the semiconductor package 10 or 13 illustrated in FIG. 1 or 4.

Referring to FIGS. 8 and 12, each of the second semiconductor chips 200 mounted on the first semiconductor chip 100 may include second semiconductor die 250 encapsulated by a second protection layer 221. The second semiconductor die 250 may be a semiconductor die including an integrated circuit formed in and/or on a semiconductor wafer (or a semiconductor substrate) such as a silicon wafer (or a silicon substrate). The second semiconductor die 250 may be memory devices such as DRAM devices. Each of the second semiconductor chips 200 may be provided in a package form by encapsulating the second semiconductor die 250 with the second protection layer 221 and by attaching the first conductive coupling members 500 to the second semiconductor die 250.

The second semiconductor die 250 may be included in each of the second semiconductor chips 200. For example, two or more second semiconductor die 250 may be embedded in each of the second semiconductor chips 200 to increase a memory capacity of the second semiconductor chips 200. For example, first to fourth die 251, 253, 255 and 257 may be vertically stacked to constitute each of the second semiconductor chips 200 in a stack package form. The first to fourth die 251, 253, 255 and 257 may be semiconductor dies having the same configuration and function.

The second protection layer 221 may be provided to cover sidewalls of a stack structure of the first to fourth die 251, 253, 255 and 257 and to expose a backside surface 258 of the fourth die 257 opposite to the first to third die 251, 253 and 255. The second protection layer 221 may be formed of an epoxy molding compound (EMC) using a molding process. If the backside surface 258 of the fourth die 257 is exposed to an external environment, heat generated in the second semiconductor chip 200 may be more readily emitted out of the second semiconductor chip 200. In order to protect the integrated circuit of the fourth die 257 having the exposed backside surface 258 from an external environment, the fourth die 257 may be provided to have a thickness greater than thicknesses of the first to third die 251, 253 and 255. The first to third die 251, 253 and 255 may have substantially the same thickness.

The plurality of second semiconductor die 250 may be electrically connected to each other by interconnection structures including second through electrodes 261 such as TSVs. Third internal interconnection lines 263 may be provided to connect the second through electrodes 261 to fifth contact portions 265 such as landing pads disposed on surfaces of the second semiconductor die 250. Fifth conductive coupling members 264 may be disposed between the second semiconductor die 250 to electrically and mechanically connect the second semiconductor die 250 to each other. The fifth conductive coupling members 264 may be micro bumps. Connection pads (not illustrated) may be additionally disposed on backside surfaces of the first to third die 251, 253 and 255 to combine the second through electrodes 261 with the fifth conductive coupling members 264. Because no semiconductor die is disposed under the backside surface 258 of the fourth semiconductor die 257, it may be not necessary to form the second through electrodes 261 such as TSVs in the fourth semiconductor die 257.

The second semiconductor die 250 may be stacked on a surface of a base die 270. The base die 270 may correspond to a semiconductor die electrically connected to the second semiconductor die 250 and may include a second interface 210 through which the second semiconductor chip 200 (i.e., the second semiconductor die 250) communicates with the first semiconductor chip 100. The second interface 210 may include a PHY region. The base die 270 may have a test function, a repair function for repairing failed memory cells of the second semiconductor die 250, and a function for redistribution of the PHY region and I/O pads.

The base die 270 may be connected to the second semiconductor die 250 by TSVs. For example, the base die 270 may include third through electrodes 271 that are electrically connected to the second semiconductor die 250 via the second through electrodes 261, the fifth conductive coupling members 264, the fifth contact portions 265 and the third internal interconnection lines 263 of the second semiconductor die 250. The third through electrodes 271 may be connected to the second through electrodes 261 in a point-to-point form. For example, the third through electrodes 271 may be disposed in a central portion of the base die 270 overlapping with central portions of the second semiconductor die 250 in which the second through electrodes 261 are disposed.

The base die 270 may further include fourth internal interconnection lines 277 and 279 that electrically connect the third through electrodes 271 to the first conductive coupling members 500 acting as external terminals of the second semiconductor chip 200. A first group of fourth internal interconnection lines 279 may be disposed in the base die 270 to connect some of the third through electrodes 271 in a central portion of the base die 270 to the first group of first conductive coupling member 510 disposed on one edge of the base die 270. The first group of fourth internal interconnection lines 279 and the first group of first conductive coupling member 510 may constitute a PHY region of the second interface 210. Referring to FIG. 6, the PHY region of the second interface 210 may be disposed to overlap with the PHY region of the first interface 110 of the first semiconductor chip 100. The PHY region of the second interface 210 may be connected to the PHY region of the first interface 110 through the first group of first conductive coupling member 510. Thus, a distance between the PHY region of the first interface 110 and the PHY region of the second interface 210 may be minimized.

A second group of fourth internal interconnection lines 277 may be disposed in the base die 270 to connect the others of the third through electrodes 271 in the central portion of the base die 270 to the second group of first conductive coupling member 530 disposed on the other edge of the base die 270. The second group of fourth internal interconnection lines 277 and the second group of first conductive coupling member 530 may constitute a direct access region 272 connected to the interposer 300. The direct access region 272 may be disposed to provide a direct access path between the interposer 300 and the second semiconductor chip 200 without the first semiconductor chip 100 intervened.

The second semiconductor chip 200 including the base die 270 and the second semiconductor die 250 vertically stacked may be provided as a high bandwidth memory (HBM).

Figure 13:
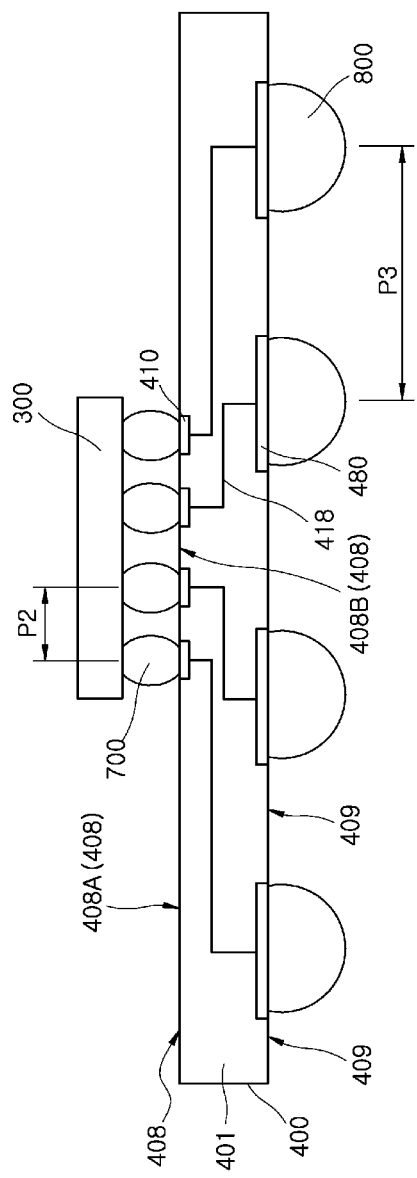
FIG. 13 is a cross-sectional view illustrating a representation of an example of a package substrate of a semiconductor package according to an embodiment.

FIG. 13 is a cross-sectional view illustrating a representation of an example of the package substrate 400 and the interposer 300 included in the semiconductor package 10 or 13 illustrated in FIG. 1 or 4.

Referring to FIG. 13, the package substrate 400 combined with the interposer 300 using the third conductive coupling members 700 may be a PCB. The package substrate 400 may be electrically and mechanically connected to the first semiconductor chip 100 through the third conductive coupling members 700 and the interposer 300. The third conductive coupling members 700 may be combined with sixth contact portions 410 disposed on the seventh surface 408 of the package substrate 400. As a result, the third conductive coupling members 700 may electrically connect the interposer 300 to circuit interconnection lines disposed in the package substrate 400. The sixth contact portions 410 may be provided in a landing pad form and may be disposed on a portion of the seventh surface 408 overlapping with the interposer 300. Referring to FIG. 13 with FIG. 1, none of the sixth contact portions 410 may be disposed on the chip overlap regions 408A (overlapping with the second semiconductor chips 200) of the seventh surface 408 of the package substrate 400.

Seventh contact portions 480 electrically connected to the sixth contact portions 410 may be disposed on the eighth surface 409 of the package substrate 400 opposite to the interposer 300 and the second semiconductor chips 200. For example, the sixth contact portions 410 may be electrically connected to the seventh contact portions 480 through fifth internal interconnection lines 418 including conductive layers and vias that substantially penetrate a package substrate body 401 of the package substrate 400. The fourth conductive coupling members 800 may be attached to the seventh contact portions 480. The fourth conductive coupling members 800 may be arrayed on the eighth surface 409 of the package substrate 400 to have a pitch P3 greater than the pitch P2 of the third conductive coupling members 700. For example, the fourth conductive coupling members 800 may be conductive members having a height greater than a height of the third conductive coupling members 700 or a width greater than a width of the third conductive coupling members 700. In addition, each of the seventh contact portions 480 may be provided in a pad form and may be disposed to have a height greater than a width greater than a width of the sixth contact portions 410.

Figure 14:
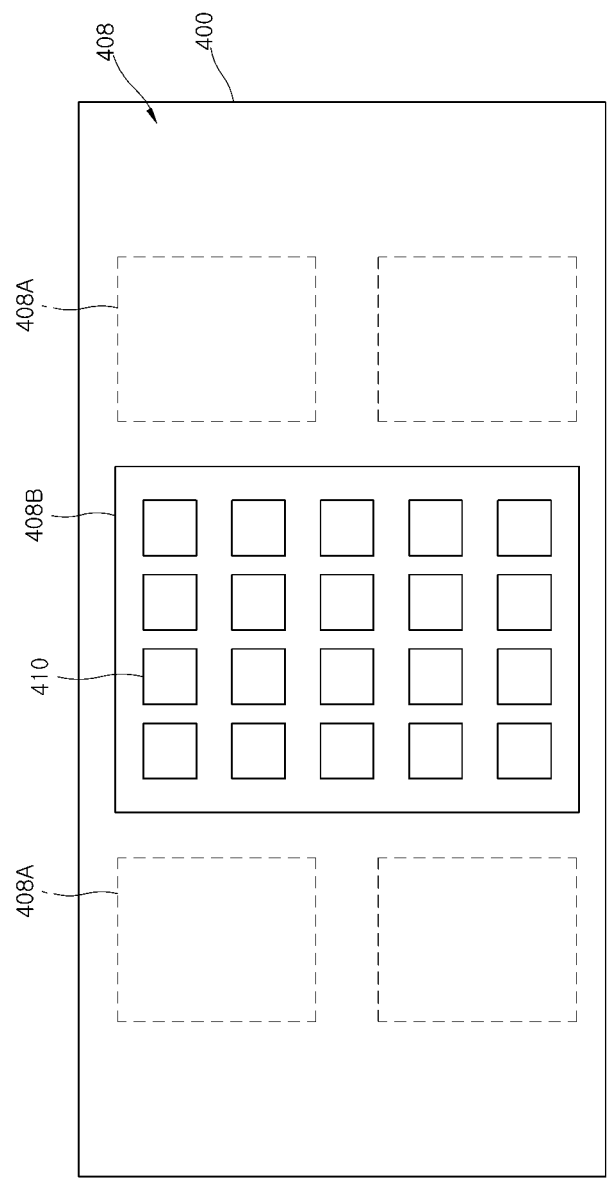
FIG. 14 is a layout diagram illustrating a representation of an example of a package substrate illustrated in FIG. 13.

FIG. 14 is a layout diagram illustrating a representation of an example of the package substrate 400 illustrated in FIG. 13.

Referring to FIG. 14, the sixth contact portions 410 disposed on the seventh surface 408 of the package substrate 400 may be arrayed in an interposer overlap region 408B that faces the first region 101 of the first semiconductor chip 100. None of the sixth contact portions 410 may be disposed on the chip overlap regions 408A. Thus, there may be no direct electric path between the package substrate 400 and the second semiconductor chips 200.

Figure 15:
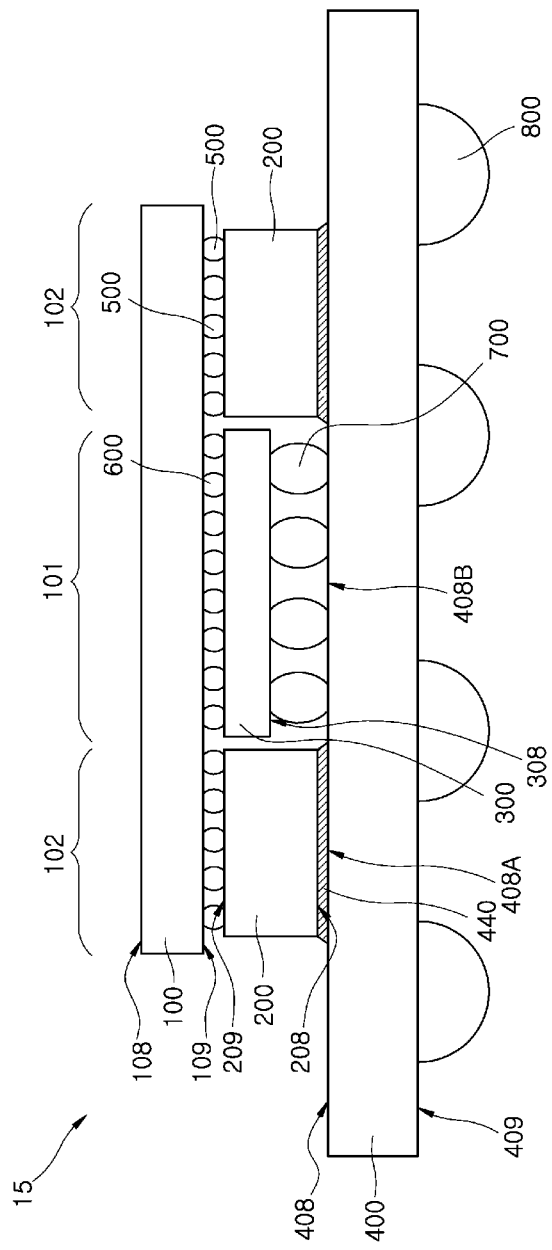
FIG. 15 is a cross-sectional view illustrating a representation of an example of a semiconductor package according to an embodiment.

FIG. 15 is a cross-sectional view illustrating a representation of an example of a semiconductor package 15 according to an embodiment. In FIG. 15, the same reference numerals as used in FIGS. 1 to 14 denote substantially the same elements. Thus, descriptions of the same elements as set forth with reference to FIGS. 1 to 14 will be omitted or briefly mentioned in the present embodiment to avoid a repeated description.

Referring to FIG. 15, the semiconductor package 15 may include the second semiconductor chips 200 combined with the second surface 109 in the second regions 102 of the first semiconductor chip 100 through the first conductive coupling members 500. The interposer 300 is combined with the second surface 109 in the first region 101 of the first semiconductor chip 100 through the second conductive coupling members 600. The narrow interposer 300 may be combined with the interposer overlap region 408B of the package substrate 400 through the third conductive coupling members 700. Because no conductive connection structure is disposed between the second semiconductor chips 200 and the chip overlap regions 408A of the package substrate 400, the third surfaces 208 of the second semiconductor chips 200 may be directly contact with or spaced apart from the chip overlap regions 408A. In some embodiments, an adhesive layer 440 may be disposed between the third surfaces 208 of the second semiconductor chips 200 and the chip overlap regions 408A to firmly fix the second semiconductor chips 200 to the package substrate 400, as illustrated in FIG. 15. The adhesive layer 440 may be an insulation layer.

Figure 16:
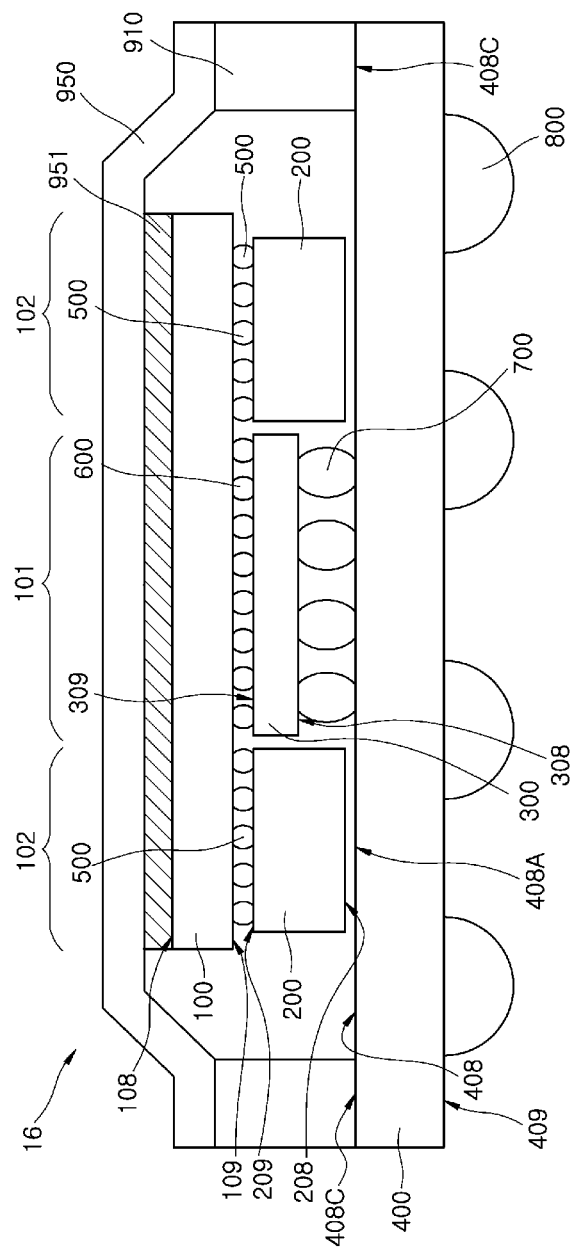
FIG. 16 is a cross-sectional view illustrating a representation of an example of a semiconductor package according to an embodiment.

FIG. 16 is a cross-sectional view illustrating a representation of an example of a semiconductor package 16 according to an embodiment. In FIG. 16, the same reference numerals as used in FIGS. 1 to 14 denote substantially the same elements. Thus, descriptions of the same elements as set forth with reference to FIGS. 1 to 14 will be omitted or briefly mentioned in the present embodiment to avoid a repeated description.

Referring to FIG. 16, the semiconductor package 16 may include the second semiconductor chips 200 combined with the first semiconductor chip 100 through the first conductive coupling members 500 and the narrow interposer 300 combined with the first semiconductor chip 100 through the second conductive coupling members 600. The narrow interposer 300 may be combined with the package substrate 400 through the third conductive coupling members 700. The first semiconductor chip 100 may be a SoC including a microprocessor or a microcontroller. Accordingly, heat may be generated in the first semiconductor chip 100 during operation. Thus, a heat spreader 950 may be provided on the first surface 108 of the first semiconductor chip 100 to emit the heat generated in the first semiconductor chip 100. The heat spreader 950 may be combined with the package substrate 400 by a supporter 910 such as a stiffener that is disposed on edges 408C of the seventh surface 408 of the package substrate 400. A thermal interface material layer 951 may be additionally disposed between the heat spreader 950 and the first surface 108 of the first semiconductor chip 100 to improve a heat radiation effect of the heat spreader 950. Each of the second semiconductor chips 200 may be provided in a HBM chip form, as described with reference to FIG. 12.

Figure 17:
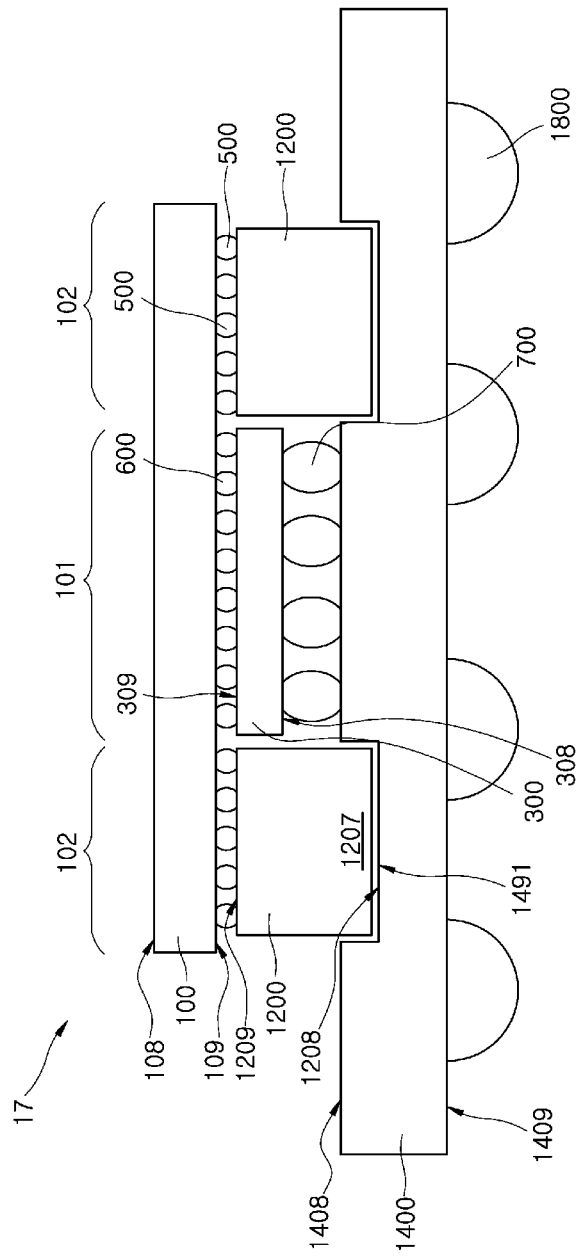
FIGS. 17 and 18 are cross-sectional views illustrating a representation of an example of a semiconductor package according to an embodiment.
Figure 18:
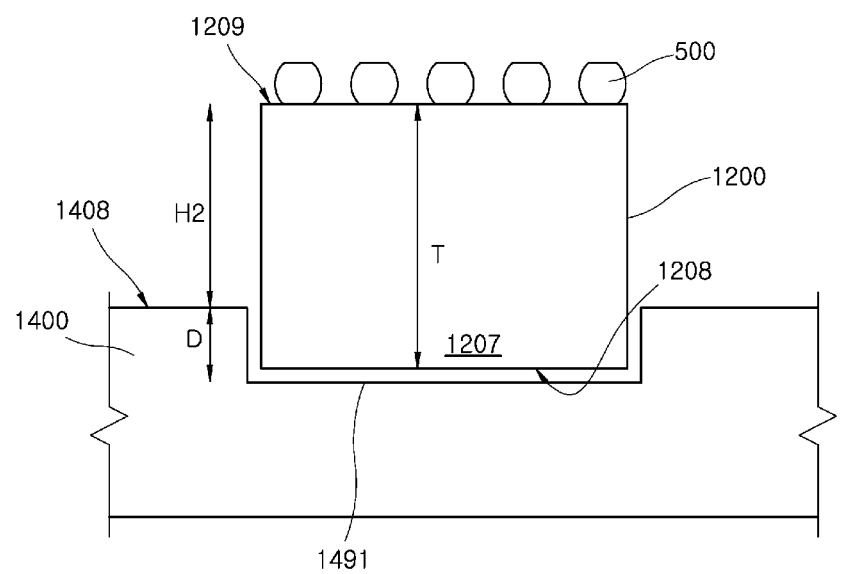

FIGS. 17 and 18 are cross-sectional views illustrating a representation of an example of a semiconductor package 17 according to an embodiment. In FIGS. 17 and 18, the same reference numerals as used in FIGS. 1 to 14 denote substantially the same elements. Thus, descriptions of the same elements as set forth with reference to FIGS. 1 to 14 will be omitted or briefly mentioned in the present embodiment to avoid a repeated description.

Referring to FIG. 17, the semiconductor package 17 may include second semiconductor chips 1200 combined with the first semiconductor chip 100 through the first conductive coupling members 500 and the narrow interposer 300 combined with the first semiconductor chip 100 through the second conductive coupling members 600. The narrow interposer 300 may be combined with a package substrate 1400 through the third conductive coupling members 700. The second semiconductor chips 1200 may be disposed so that fourth surfaces 1209 of the second semiconductor chips 1200 face the second surface 109 of the first semiconductor chip 100. A seventh surface 1408 of the package substrate 1400 may have an uneven profile to provide recessed grooves 1491. A portions 1207 of the second semiconductor chip 1200 may be inserted in the recessed groove 1491. The inserted portion of the second semiconductor chip 1200 may include third surfaces 1208 that face the fourth surfaces 1209.

As illustrated in FIG. 18, since the portion 1207 of the second semiconductor chip 1200 is inserted into the recessed groove 1491, a height H2 from the seventh surface 1408 of the package substrate 1400 to the fourth surfaces 1209 of the second semiconductor chip 1200 may be reduced from a thickness T of the second semiconductor chip 1200. The height H2 may be reduced by a depth D of the recessed groove 1491. As a result, a distance between the first semiconductor chip 100 and the package substrate 1400 may be reduced to decrease a total thickness of the semiconductor package 17. Each of the second semiconductor chips 1200 may be provided in a HBM, as described with reference to FIG. 12. Fourth conductive coupling members 1800 may be attached to an eighth surface 1409 of the package substrate 1400 opposite to the first semiconductor chip 100.

Figure 19:
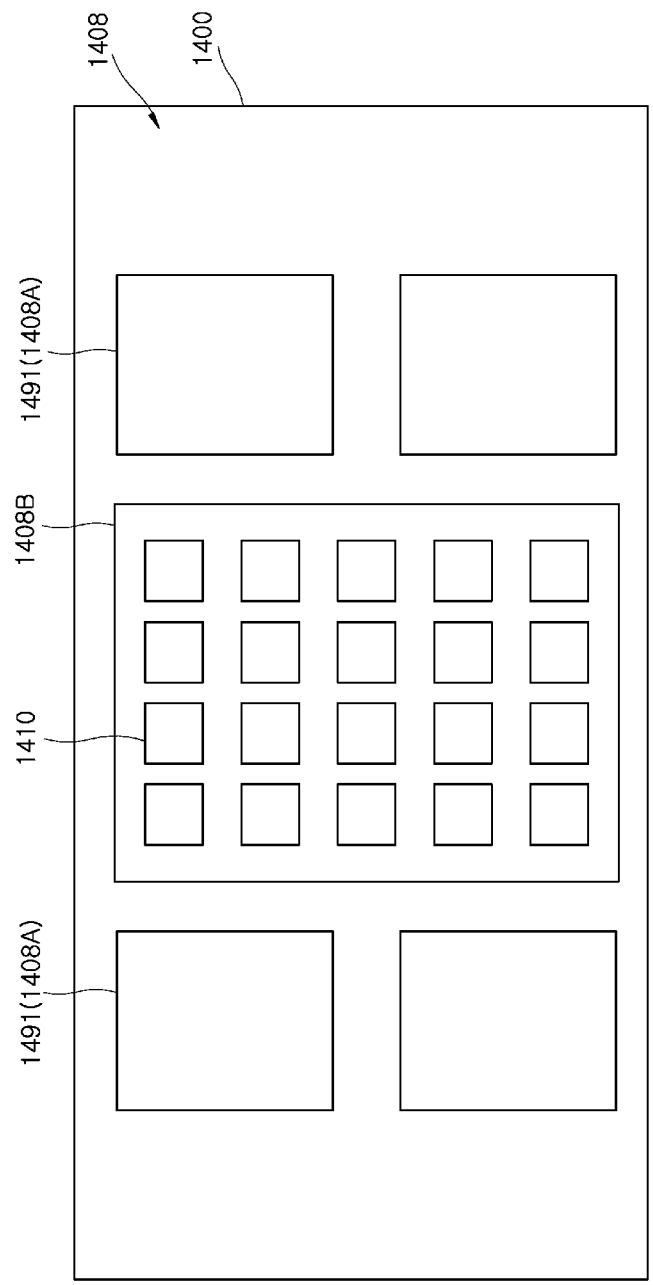
FIG. 19 is a layout diagram illustrating a representation of an example of a package substrate illustrated in FIGS. 17 and 18.

FIG. 19 is a layout diagram illustrating a representation of an example of the package substrate 1400 of the semiconductor package 17 illustrated in FIGS. 17 and 18.

Referring to FIG. 19, sixth contact portions 1410 disposed on the seventh surface 1408 of the package substrate 1400 may be arrayed in an interposer overlap region 1408B that faces the first region 101 of the first semiconductor chip 100. None of the sixth contact portions 1410 may be disposed on chip overlap regions 1408A that overlap with the second semiconductor chip 1200, and a plurality of the recessed grooves 1491 may be formed in the chip overlap regions 1408A, as illustrated in FIGS. 17 and 18.

Figure 20:
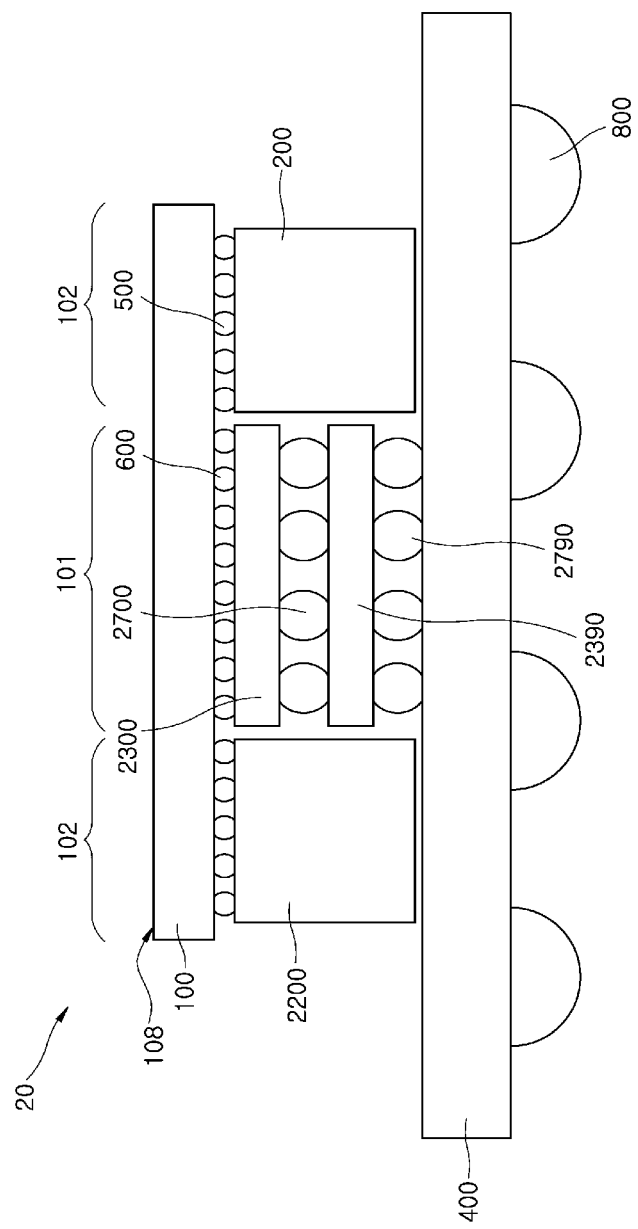
FIG. 20 is a cross-sectional view illustrating a representation of an example of a semiconductor package according to an embodiment.
Figure 21:
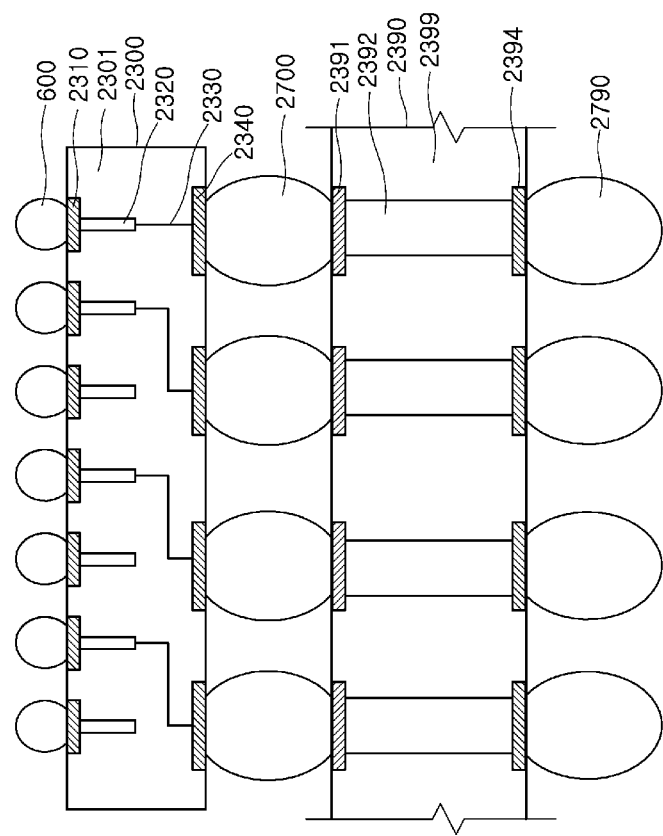
FIG. 21 is a cross-sectional view illustrating a representation of an example of an interposer stack structure included in the semiconductor package of FIG. 20.

FIGS. 20 and 21 are cross-sectional views illustrating a representation of an example of a semiconductor package 20 according to an embodiment. In FIGS. 20 and 21, the same reference numerals as used in FIGS. 1 to 19 denote substantially the same elements. Thus, descriptions of the same elements as set forth with reference to FIGS. 1 to 19 will be omitted or briefly mentioned in the present embodiment to avoid a repeated description.

Referring to FIG. 20, the semiconductor package 20 may include second semiconductor chips 2200 combined with the first semiconductor chip 100 through the first conductive coupling members 500, a narrow interposer 2300 combined with the first semiconductor chip 100 through the second conductive coupling members 600, and a support interposer 2390 combined with the package substrate 400. Each of the second semiconductor chips 2200 may be provided in a HBM, as described with reference to FIG. 12. The narrow interposer 2300 may be electrically and mechanically connected to the support interposer 2390 through sixth conductive coupling members 2700. The support interposer 2390 may be an intermediate member that supports the narrow interposer 2300. The support interposer 2390 connects the narrow interposer 2300 to the package substrate 400. If a thickness of the second semiconductor chip 2200 increases, it may be difficult to connect the first semiconductor chip 100 to the package substrate 400 with only the narrow interposer 2300. The support interposer 2390 may be employed as a member for extending connection paths between the narrow interposer 2300 and the package substrate 400.

Referring to FIGS. 20 and 21, the narrow interposer 2300 may have substantially the same configuration as the interposer 300 described with reference to FIG. 11, and the sixth conductive coupling members 2700 may correspond to the third conductive coupling members 700. The narrow interposer 2300 may include third contact portions 2310 disposed on one surface of an interposer body 2301 opposite to the support interposer 2390 and fourth contact portions 2340 disposed on another surface of the interposer body 2301 opposite to the second conductive coupling members 600. The narrow interposer 2300 may further include a first group of second internal interconnection lines 2320 corresponding to the first through electrodes 320 of FIG. 11 and a second group of second internal interconnection lines 2330 that electrically connect the first through electrodes 2320 to the fourth contact portions 2340. The sixth conductive coupling members 2700 may be disposed between the narrow interposer 2300 and the support interposer 2390 to electrically and mechanically connect the narrow interposer 2300 to the support interposer 2390.

The support interposer 2390 may include eighth contact portions 2391 disposed on one surface of an interposer body 2399 opposite to the package substrate 400 and ninth contact portions 2394 disposed on another surface of the interposer body 2399 opposite to the sixth conductive coupling members 2700. The support interposer 2390 may further include sixth internal interconnection lines 2392 that penetrate the interposer body 2399 to electrically connect the eighth contact portions 2391 to the ninth contact portions 2394. The sixth internal interconnection lines 2392 may correspond to fourth through electrodes. Seventh conductive coupling members 2790 may be attached to the ninth contact portions 2394 to electrically and mechanically connect the support interposer 2390 to the package substrate 400.

The eighth contact portions 2391, the ninth contact portions 2394, the sixth conductive coupling members 2700, and the seventh conductive coupling members 2790 may be arrayed to have a pitch which is greater than a pitch of the second conductive coupling members 600. The support interposer 2390 may include circuit interconnection lines having a relatively large pitch as compared with the narrow interposer 2300. The support interposer 2390 may be an organic interposer. Since the narrow interposer 2300 is directly connected to the first semiconductor chip 100, the narrow interposer 2300 may be realized using a silicon interposer in or on which fine circuit patterns can be formed.

As described above, the semiconductor package 20 may include a stack structure of the interposers 2300 and 2390. The stack structure may be disposed between the first semiconductor chip 100 and the package substrate 400. Accordingly, the first semiconductor chip 100 may be electrically connected to the package substrate 400 through the interposers 2300 and 2390 even though a thickness of the second semiconductor chip 2200 increases.

Figure 22:
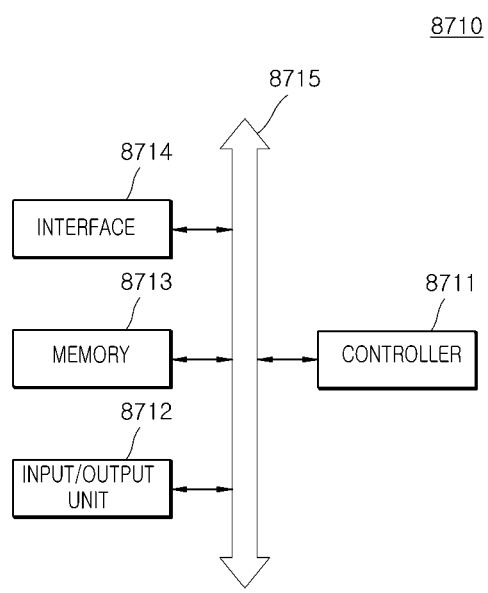
FIG. 22 is a block diagram illustrating a representation of an example of an electronic system including at least one of the packages according to some embodiments.

FIG. 22 is a block diagram illustrating a representation of an example of an electronic system 8710 including at least one of the semiconductor packages according to the embodiments. The electronic system 8710 may include a controller 8711, an input/output device 8712, and a memory 8713. The memory 8713 and the controller 8711 may be replaced with any one of the semiconductor packages according to the above embodiments. The controller 8711, the input/output device 8712 and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include one or more of the semiconductor packages according to embodiments of the present disclosure. The input/output device 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this example, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system, and an information transmission/reception system.

If the electronic system 8710 is an equipment capable of performing wireless communication, the electronic system 8710 may be used in a communication system such as, for example but not limited to, of CDMA (code division multiple access), GSM (global system for mobile communications), NADC (north American digital cellular), E-TDMA (enhanced-time division multiple access), WCDAM (wideband code division multiple access), CDMA2000, LTE (long term evolution) and Wibro (wireless broadband Internet).

Embodiments of the present disclosure have been disclosed for illustrative purposes. Those skilled in the art will appreciate that various modifications, additions and substitutions are possible, without departing from the scope and spirit of the present disclosure and the accompanying claims.

What is claimed is:

1. A semiconductor package comprising:
a first semiconductor chip including a first group of first contact portions, a second group of first contact portions, a third group of first contact portions and a fourth group of first contact portions disposed on a front side surface thereof, wherein the second group of first contact portions are connected to the third group of first contact portions through a second group of first internal interconnection lines;
second semiconductor chips disposed on the front side surface of the first semiconductor chip to respectively overlap with portions of the first semiconductor chip, wherein each of the second semiconductor chips includes a first group of second contact portions and a second group of second contact portions disposed on a front side surface thereof to respectively face the first group of first contact portions and the second group of first contact portions;
an interposer disposed on the front side surface of the first semiconductor chip to overlap with a portion of the first semiconductor chip, wherein the interposer includes a second group of third contact portions and a first group of third contact portions disposed on a front side surface thereof to respectively face the third and fourth groups of first contact portions;
a package substrate disposed on backside surfaces of the second semiconductor chips opposite to the first semiconductor chip, wherein the interposer is disposed between the first semiconductor chip and the package substrate;
a first group of first conductive coupling members and a second group of first conductive coupling members connecting the first and second groups of first contact portions to the first and second groups of second contact portions, respectively;
a second group of second conductive coupling members and a first group of second conductive coupling members connecting the third and fourth groups of first contact portions to the second and first groups of third contact portions, respectively; and
third conductive coupling members combining the interposer with the package substrate,
wherein the second semiconductor chips are electrically connected to the package substrate via the interposer,
wherein the first semiconductor chip is electrically connected to the package substrate via the interposer,
wherein the second group of first contact portions are disposed to be adjacent to a band-shaped central region of the first semiconductor chip;
wherein the third group of first contact portions are disposed on edges of the band-shaped central region of the first semiconductor chip to be adjacent to the second group of first contact portions; and wherein the second group of first internal interconnection lines extend from the band-shaped central region of the first semiconductor chip into edges of the first semiconductor chip.

2. The semiconductor package of claim 1, wherein the first semiconductor chip further includes a dielectric layer disposed along the front side surface thereof to insulate the first to fourth groups of first contact portions and the second group of first internal interconnection lines from each other.

3. The semiconductor package of claim 2, wherein the first semiconductor chip further includes a first group of first internal interconnection lines that substantially penetrate the dielectric layer to electrically connect the first group of first contact portions to a first semiconductor die embedded in the first semiconductor chip.

4. The semiconductor package of claim 3, wherein the first group of first contact portions, the first group of first internal interconnection lines, the first group of first conductive coupling members and the first group of second contact portions constitute first electric signal paths that electrically connect the first semiconductor chip to the second semiconductor chips.

5. The semiconductor package of claim 3, wherein the dielectric layer electrically insulates the second group of first internal interconnection lines from the first semiconductor die.

6. The semiconductor package of claim 3, wherein the first semiconductor chip further includes a third group of first internal interconnection lines that substantially penetrate the dielectric layer to electrically connect the fourth group of first contact portions to the first semiconductor die.

7. The semiconductor package of claim 6, wherein the fourth group of first contact portions, the third group of first internal interconnection lines, the first group of second conductive coupling members and the first group of third contact portions constitute third electric signal paths that electrically connect the interposer to the first semiconductor chip.

8. The semiconductor package of claim 1, wherein the second groups of first contact portions, the second group of first internal interconnection lines, the third group of first contact portions, the second group of first conductive coupling members, the second group of second contact portions, the second group of third contact portions and the second group of second conductive coupling members constitute second electric signal paths that electrically connect the interposer to the second semiconductor chip.

9. The semiconductor package of claim 1,
wherein the second group of first contact portions are disposed to be adjacent to the third group of first contact portions; and
wherein the second group of second contact portions are disposed on edges of the second semiconductor chips adjacent to the interposer to face the second group of first contact portions.

10. The semiconductor package of claim 1, wherein the second semiconductor chips are disposed to overlap with edges of the first semiconductor chip.

11. The semiconductor package of claim 10, wherein the interposer is disposed between the second semiconductor chips to overlap with the central region of the first semiconductor chip.

12. The semiconductor package of claim 11,
wherein the central region of the first semiconductor chip extends in a first direction crossing the first semiconductor chip to have the band shape;

wherein the second semiconductor chips are located at both sides of the band-shaped central region of the first semiconductor chip; and
wherein the interposer is disposed to overlap with the band-shaped central region of the first semiconductor chip.

13. The semiconductor package of claim 12, wherein the interposer has a length which is greater than a width of the first semiconductor chip in the first direction.

14. The semiconductor package of claim 13, wherein the second semiconductor chips include four chips which are respectively disposed on four corner regions of the first semiconductor chip.

15. The semiconductor package of claim 1, wherein the second semiconductor chips are in contact with or spaced apart from the package substrate.

16. The semiconductor package of claim 1, further comprising an adhesive layer disposed between the package substrate and each of the second semiconductor chips.

17. The semiconductor package of claim 1, wherein each of the first and second groups of second conductive coupling members has a smaller size than a size of each of the third conductive coupling members.

18. A semiconductor package comprising:
a first semiconductor chip including a first group of first contact portions, a second group of first contact portions, a third group of first contact portions and a fourth group of first contact portions disposed on a front side surface thereof, wherein the second group of first contact portions are connected to the third group of first contact portions through a second group of first internal interconnection lines;
second semiconductor chips disposed on the front side surface of the first semiconductor chip to respectively overlap with portions of the first semiconductor chip, wherein each of the second semiconductor chips includes a first group of second contact portions and a second group of second contact portions disposed on a front side surface thereof to respectively face the first group of first contact portions and the second group of first contact portions;
an interposer disposed on the front side surface of the first semiconductor chip to overlap with a portion of the first semiconductor chip, wherein the interposer includes a second group of third contact portions and a first group of third contact portions disposed on a front side surface thereof to respectively face the third and fourth groups of first contact portions;
a package substrate disposed on backside surfaces of the second semiconductor chips opposite to the first semiconductor chip, wherein the interposer is disposed between the first semiconductor chip and the package
a first group of first conductive coupling members and a second group of first conductive coupling members connecting the first and second groups of first contact portions to the first and second groups of second contact portions, respectively;
a second group of second conductive coupling members and a first group of second conductive coupling members connecting the third and fourth groups of first contact portions to the second and first groups of third contact portions, respectively; and
third conductive coupling members combining the interposer with the package substrate,
wherein the second semiconductor chips are electrically connected to the package substrate via the interposer, wherein the first semiconductor chip is electrically connected to the package substrate via the interposer,
wherein the second semiconductor chips are disposed to overlap with edges of the first semiconductor chip,
wherein the interposer is disposed between the second semiconductor chips to overlap with a central region of the first semiconductor chip,
wherein the central region of the first semiconductor chip extends in a first direction crossing the first semiconductor chip to have a band shape,
wherein the second semiconductor chips are located at both sides of the band-shaped central region of the first semiconductor chip,
wherein the interposer is disposed to overlap with the band-shaped central region of the first semiconductor chip,
wherein the interposer has a length which is greater than a width of the first semiconductor chip in the first direction,
wherein the second semiconductor chips include four chips which are respectively disposed on four corner regions of the first semiconductor chip,
wherein the second group of first contact portions are disposed to be adjacent to the band-shaped central region of the first semiconductor chip;
wherein the third group of first contact portions are disposed on edges of the band-shaped central region of the first semiconductor chip to be adjacent to the second group of first contact portions; and
wherein the second group of first internal interconnection lines extend from the band-shaped central region of the first semiconductor chip into edges of the first semiconductor chip.

19. A semiconductor package comprising:
a first semiconductor chip including a first group of first contact portions, a second group of first contact portions, a third group of first contact portions and a fourth group of first contact portions disposed on a front side surface thereof, wherein the second group of first contact portions are connected to the third group of first contact portions through a second group of first internal interconnection lines;
second semiconductor chips disposed on the front side surface of the first semiconductor chip to respectively overlap with portions of the first semiconductor chip, wherein each of the second semiconductor chips includes a first group of second contact portions and a second group of second contact portions disposed on a front side surface thereof to respectively face the first group of first contact portions and the second group of first contact portions;
an interposer disposed on the front side surface of the first semiconductor chip to overlap with a portion of the first semiconductor chip, wherein the interposer includes a second group of third contact portions and a first group of third contact portions disposed on a front side surface thereof to respectively face the third and fourth groups of first contact portions;
a package substrate disposed on backside surfaces of the second semiconductor chips opposite to the first semiconductor chip, wherein the interposer is disposed between the first semiconductor chip and the package substrate;
a first group of first conductive coupling members and a second group of first conductive coupling members connecting the first and second groups of first contact portions to the first and second groups of second contact portions, respectively;
a second group of second conductive coupling members and a first group of second conductive coupling members connecting the third and fourth groups of first contact portions to the second and first groups of third contact portions, respectively; and
third conductive coupling members combining the interposer with the package substrate,
wherein the second semiconductor chips are electrically connected to the package substrate via the interposer,
wherein the first semiconductor chip is electrically connected to the package substrate via the interposer,
wherein the second semiconductor chips are disposed to overlap with edges of the first semiconductor chip,
wherein the interposer is disposed between the second semiconductor chips to overlap with a central region of the first semiconductor chip,
wherein the central region of the first semiconductor chip extends in a first direction crossing the first semiconductor chip to have a band shape,
wherein the second semiconductor chips are located at both sides of the band-shaped central region of the first semiconductor chip,
wherein the interposer is disposed to overlap with the band-shaped central region of the first semiconductor chip,
wherein the interposer has a length which is greater than a width of the first semiconductor chip in the first direction,
wherein the second semiconductor chips include four chips which are respectively disposed on four corner regions of the first semiconductor chip,
wherein the second group of first contact portions are disposed to be adjacent to the band-shaped central region of the first semiconductor chip;
wherein the third group of first contact portions are disposed on edges of the band-shaped central region of the first semiconductor chip to be adjacent to the second group of first contact portions; and
wherein the second group of first internal interconnection lines extend from the band-shaped central region of the first semiconductor chip into edges of the first semiconductor chip.

* * * * *